United States Patent
Jang

(10) Patent No.: US 6,489,646 B1
(45) Date of Patent: Dec. 3, 2002

(54) DRAM CELLS WITH BURIED TRENCH CAPACITORS

(75) Inventor: Wen-Yueh Jang, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/052,335

(22) Filed: Jan. 23, 2002

(51) Int. Cl.$^7$ .............................................. H01L 27/108
(52) U.S. Cl. ..................... 257/296; 257/301; 257/304
(58) Field of Search ................................. 257/296, 301, 257/302, 303, 304, 305; 438/243, 246, 248

(56) References Cited

U.S. PATENT DOCUMENTS

| | | | | |
|---|---|---|---|---|
| 4,679,300 A | * | 7/1987 | Chan et al. .................. | 257/301 |
| 6,037,208 A | * | 3/2000 | Wei ............................. | 438/227 |
| 6,297,088 B1 | * | 10/2001 | King ........................... | 438/243 |

* cited by examiner

Primary Examiner—Tuan H. Nguyen
(74) Attorney, Agent, or Firm—Rosenberg, Klein & Lee

(57) ABSTRACT

A method for forming an array of DRAM cells with buried trench capacitors is provided. The present method utilizes a photolithography and etching process to laterally remove away the parts of a collar oxide layer around the inner sidewalls of buried trench capacitors neighboring with each other in a pair of neighboring buried trench capacitors before a dielectric layer of the capacitor is formed. By way of replacing the removed parts of the collar oxide layer with a silicon nitride/silicon dioxide (NO) composite layer and using a strip type pattern along the pattern of the buried trench capacitors to define active areas for source/drain regions of access transistors over the buried trench capacitors, additional capacitance is occurred in the peripheral area of the neighboring buried trench capacitors which are not used by a conventional buried trench capacitor. As a result, the capacitance of the buried trench capacitor is increased without either increasing the depth of the buried trench capacitor or thinning down the effective insulator's thickness of the buried trench capacitor.

6 Claims, 17 Drawing Sheets

DRAM CELLS WITH BURIED TRENCH CAPACITORS

BACKGROUND OF THE INVENTION

1. Field of the Invention

The present invention relates to a dynamic random access memory (DRAM) process, and more particularly, to a process for manufacturing a dynamic random access memory device with buried trench capacitors.

2. Description of the Prior Art

Dynamic random access memory (DRAM) is a type of volatile memory having a signal which is stored in a digital state depending on the charging state of the capacitor in each memory cell. A DRAM memory unit comprises an access transistor and a storage capacitor. The source terminal of the access transistor is connected to the storage electrode, known as the upper electrode, of a storage capacitor. The lower electrode of the storage capacitor is connected to a fixed voltage source. Between the upper electrode and the lower electrode is a dielectric thin film.

A capacitor is at the "heart" of a DRAM storage device. When the amount of electric charges capable of being stored in the capacitor is large, soft errors produced by a particles can be greatly lowered. Furthermore, a large charge storage capacity in the DRAM capacitor is able to lower its refreshing frequency. When a small charge storage capacity is needed in a DRAM capacitor, a conventional two-dimensional or planar type of capacitor can be fabricated in the integrated circuit. However, a planar type capacitor occupies a rather large surface area on the semiconductor substrate surface, hence is not suitable for high integration. Therefore, three-dimensional capacitors, for example, the so-called stacked type or trench type capacitors, are used for increasing the level of integration of DRAMs.

FIGS. 1A through 1L are schematic cross-sectional views showing the progression of manufacturing steps in the fabrication of an array of trench-type DRAM cells according to a conventional method. As shown in FIG. 1A and FIG. 2A, wherein FIG. 2A is a top view for illustrating the following steps and FIG. 1A is a cross-sectional view along line I—I of FIG. 2A, a pad oxide layer 101 and a silicon nitride layer 102 are sequentially formed on a P type silicon substrate 100. Then, a plurality of rows of trenches 103 are formed in the P type silicon substrate 100 by patterning the silicon nitride layer 102 and the pad oxide layer 101 with a conventional photolithography and etching method. As shown in FIG. 2A, the silicon nitride layer 102 and the pad oxide layer 101 are patterned in the way such that each pair of neighboring trenches 103 in each row of the trenches 103 is separated from each other for a predetermined distance.

Referring next to FIG. 1B, a conformal silicon nitride layer 104 is deposited on the P type silicon substrate 100, and then a sacrificial layer 105 is formed on the conformal silicon nitride layer 104. Referring to FIG. 1C, the sacrificial layer 105 is partially etched away such that the depth of the left sacrificial layer 105 is under the surface of the pad oxide layer 101, and a portion of the conformal silicon nitride layer 104 in the trench 103 is exposed. Then, referring to FIG. 1D, the portion of the conformal silicon nitride layer 104 uncovered by the left sacrificial layer 105 is etched away. Afterward, the left sacrificial layer 105 is removed.

Referring to FIG. 1E, a collar oxide layer 106 is then formed around inner sidewalls of each trench 103 uncovered by the left conformal silicon nitride layer 104 by thermal oxidation. Thereafter, the left conformal silicon nitride layer 104 is removed with hot $H_3PO_4$ aqueous solution. Subsequently, referring to FIG. 1F, an N type diffusion region 107 is formed around the surrounding of each trench 103 in the silicon substrate 100, using thermal diffusion with N type impurity gas to dope the silicon substrate 100. The N type diffusion region 107 is used as a bottom electrode of the buried trench capacitor. The regions of the silicon substrate 100 covered by the collar oxide layer 106 are not doped.

Referring next to FIG. 1G, a silicon nitride/silicon dioxide (NO) composite layer 108 is formed around the inner peripheral area of each trench 103 uncovered by the collar oxide layer 106 for serving as a dielectric layer of a buried trench capacitor which will be formed later. Referring to FIG. 1H, depositing an N type doped polysilicon layer 109 on the silicon substrate 100 to fill each trench 103 and serve as the top electrode of the buried trench capacitor. The N type doped polysilicon layer 109 is partially etched to expose a part of the collar oxide layer 106 in the trench 103. Referring to FIG. 1I, etching the exposed part of the collar oxide layer 106 until the surface of the N type doped polysilicon layer 109.

Referring to FIG. 1J, subsequently, depositing an amorphous silicon layer on the silicon substrate 100, and partially etching the amorphous silicon layer so that the left amorphous silicon layer forms a buried silicon strap 110 in the trench 103. The buried silicon strap 110 is then doped with N type dopants by ion implantation. An annealing step is performed so that the impanted N type dopants in the buried silicon strap 110 are out diffused to the silicon substrate 100. The N type doped buried silicon strap 110 electrically couples the top electrode of the buried trench capacitor and a source/drain region of an access transistor on the silicon substrate 100, which will be formed later. In accordance with the above steps, the buried trench capacitors are completed.

Referring to FIGS. 1K and 2B, wherein FIG. 2B is a top view for illustrating the following steps and FIG. 1K is a cross-sectional view along line II—II of FIG. 2B, defining active areas for source/drain regions of the access transistors of the DRAM cells using an island type pattern 111. As a result, a trench isolation region 112 is formed in the silicon substrate 100, passing through the respective buried silicon strap 110 and a part of the respective buried trench capacitor, and between the pair of neighboring buried trench capacitors.

Referring to FIGS. 1L and 2C, wherein FIG. 2C is a top view for illustrating the following steps and FIG. 1L is a cross-sectional view along line III—III of FIG. 2, an oxide layer is deposited on the silicon substrate 100 to fill the trench isolation region 112, and then planarized by a chemical mechanical polishing process. At the chemical mechanical polishing process, the silicon nitride layer 102 and the pad oxide layer 101 are removed. Thereafter, an N well is formed in the silicon substrate 100 by ion implantation. The N well electrically couples the bottom electrode of the buried trench capacitor formed of the N type diffusion region 107 to a positive voltage bias. A gate oxide layer 114 is formed on the silicon substrate 100 by thermal oxidation. Then, a gate layer 115 serving as word lines of the DRAM cells are formed by depositing and patterning an N type doped polysilicon layer and a tungsten silicide layer. Then, the source/drain regions 116 of the access transistors are formed by ion implantation. As a consequence, the trench type DRAM cells are completed.

However, in accordance with the conventional process of manufacturing the trench type DRAM cells, the trench capacitor becomes a major limited factor in device scaling. To keep capacitance unchanged, the trench of the trench capacitor must be etched deeper to compensate capacitor area loss from horizontal scaling. It becomes very difficult and costly to etch the trench as the aspect ratio of the trench increases larger. On the other hand, because the trench capacitor is formed before other devices, increasing unit capacitance by reducing the effective dielectric thickness of the trench capacitor seems to be very difficult due to limited high dielectric materials that can sustain high temperature are available.

Accordingly, it is a need to provide an improved process for manufacturing a trench type DRAM cell, which can increase capacitance of the trench capacitor without the drawbacks of the conventional process.

SUMMARY OF THE INVENTION

It is an objective of the present invention to provide a method for forming an array of DRAM cells with buried trench capacitors, which can increase capacitance of the buried trench capacitor without either deepening the depth of the buried trench capacitor or thinning down the effective insulator's thickness of the buried trench capacitor.

It is another objective of the present invention to provide a method for forming an array of DRAM cells with buried trench capacitors, which utilizes a strip type pattern along the pattern of the buried trench capacitors, instead of the island pattern used in a conventional DRAM process, to define active areas for source/drain regions of access transistors over the buried trench capacitors on a semiconductor substrate, such that the process window of the strip type pattern can be greatly improved.

It is a further objective of the present invention to provide a method for forming an array of DRAM cells with buried trench capacitors, which utilizes a strip type pattern along the pattern of the buried trench capacitors, instead of the island pattern used in a conventional DRAM process, to define active areas for source/drain regions of access transistors over the buried trench capacitors on a semiconductor substrate, so that overall contact resistance of a buried conductive strap which electrically couples the top electrode of the buried trench capacitor and a source/drain region of the access transistor can be reduced and properly controlled.

In order to achieve the above objectives, the present invention provides a method for forming an array of DRAM cells with buried trench capacitors. The present method begins with providing a semiconductor substrate with a first conductivity. A first dielectric layer is formed on the semiconductor substrate. The first dielectric layer then is patterned to form a plurality of rows of buried trenches in the semiconductor substrate. Each row of the buried trenches comprises a plurality of pairs of neighboring buried trenches, and each pair of the neighboring buried trenches separates from each other for a predetermined distance. A conformal dielectric layer is formed on the buried trenches. Then, a sacrificial layer is formed on the conformal dielectric layer. A portion of the sacrificial layer is removed in order that the depth of the sacrificial layer is below the surface of the first dielectric layer. The portion of the conformal dielectric layer uncovered by the sacrificial layer is removed. Then, the left portion of the sacrificial layer is removed. A collar oxide layer is formed on inner sidewalls of the buried trenches uncovered by the left portions of the conformal dielectric layer. The left portions of the conformal dielectric layer then is removed. A diffusion region with a second conductivity opposite to the first conductivity is formed around the surrounding of each buried trench in the semiconductor substrate except for the portion of the semiconductor substrate covered by the collar oxide layer. The diffusion region is served as a first electrode of a buried trench capacitor. Following, removing the portions of the collar oxide layer around the inner sidewalls of the buried trenches neighboring with each other by a photolithography and etching process. Forming a second dielectric layer on the inner peripheral area of each buried trench uncovered by the collar oxide layer by steps of including oxidation such that an inversion layer is induced on the interface between the second dielectric layer and the semiconductor substrate. The second dielectric layer is served for an insulating layer of the buried trench capacitor. A conductive layer with the second conductivity is formed on the semiconductor substrate to fill each buried trench. The conductive layer is served as a second electrode of the buried trench capacitor. Removing the conductive layer until a portion of the collar oxide layer is exposed. Then, the exposed portion of the collar oxide layer is removed. A buried conductive strap with the second conductivity is formed on the first conductive layer within each buried trench. Defining a plurality of active area on the semiconductor substrate along the rows of the buried trenches using a strip type pattern. Then, an oxide layer is formed on the semiconductor substrate to fill the buried trenches. Planarizing the oxide layer to form a trench isolation region on each buried trench capacitor. A well with the second conductivity is formed in the semiconductor substrate to electrically couple with the diffusion regions. A gate oxide layer is formed on the semiconductor substrate. A conductive gate layer is formed on the gate oxide layer for serving as word lines of an array of DRAM cells. Source/drain regions with the second conductivity are formed in the semiconductor substrate. One source/drain region electrically couples to the buried conductive strap and the other source/drain region is served as a bit line of one DRAM cell. In accordance with the present method, a photolithography and etching process is used to laterally remove away the parts of the collar oxide layer around the inner sidewalls of buried trench capacitors neighboring with each other in a pair of neighboring buried trench capacitors before the dielectric layer of the capacitor is formed. By way of replacing the removed parts of the collar oxide layer with the dielectric layer of the capacitor, for example, a silicon nitride/silicon dioxide (NO) composite layer, and using a strip type pattern along the rows of the buried trench capacitors to define active areas for source/drain regions of access transistors over the buried trench capacitors, additional capacitance is occurred in the peripheral area of the neighboring buried trench capacitors which are not used by a conventional buried trench capacitor. As a result, the capacitance of the buried trench capacitor is increased without either increasing the depth of the buried trench capacitor or thinning down the effective insulator's thickness of the buried trench capacitor.

BRIEF DESCRIPTION OF THE DRAWINGS

The present invention can be best understood through the following description and accompanying drawings, wherein.

DESCRIPTION OF THE PREFERRED EMBODIMENTS

The DRAM (dynamic random access memory) cell structure and method for making a high-density array of DRAM cells having buried trench capacitors of the present invention are described in detail below. In accordance with one preferred embodiment of the present invention, the DRAM cells are formed using N-channel field effect transistors (FETs) as the access transistors in each of the memory cells that are formed on a P type semiconductor substrate over the buried trench capacitors. This allows this invention to utilize the space under the device area to make buried capacitors having increased capacitance while reducing the cell area. It should also be well understood by one skilled in the art that by including additional process steps, in addition to those described in the following embodiment, other types of devices can also be included on the DRAM chip. For example, by forming N-doped well regions in the P type semiconductor substrate, P-channel FETs can also be provided from which Complementary Metal-Oxide-Semiconductor (CMOS) circuits can be formed, such as are used for the peripheral circuits on the DRAM chip.

Figure 1A:
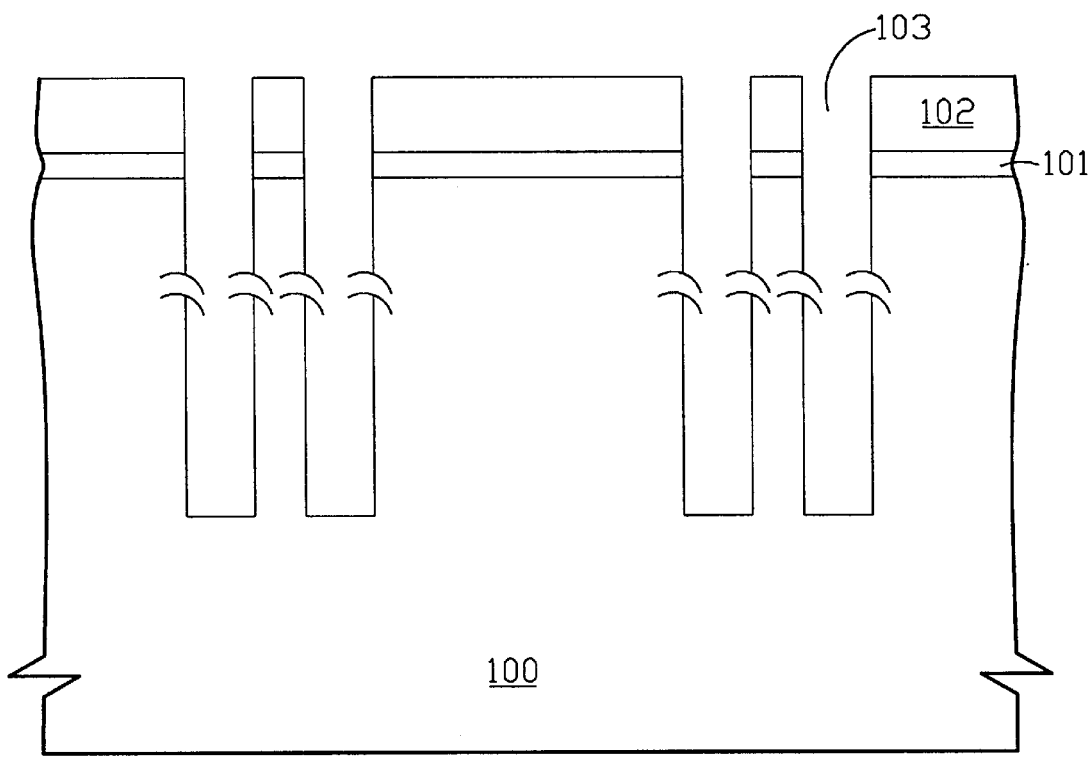
FIG. 1A through FIG. 1L are schematic cross-sectional views of various steps of manufacturing an array of trench type DRAM cells according to a conventional method.
Figure 1B:
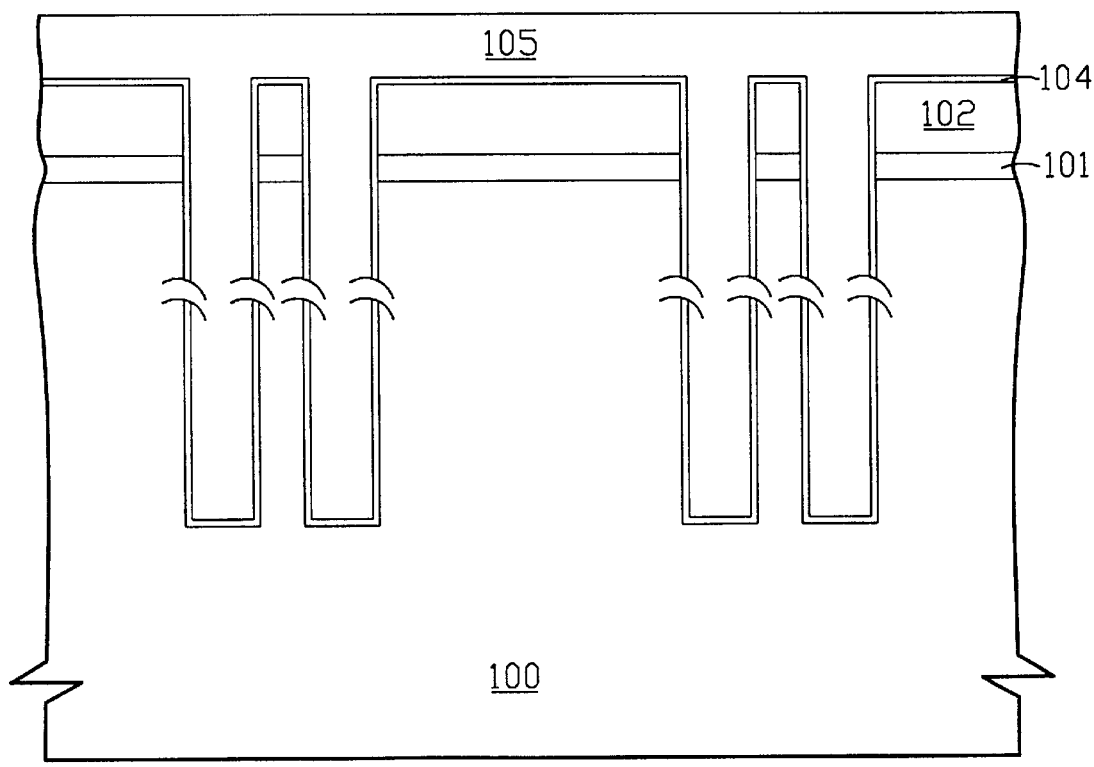
Figure 1C:
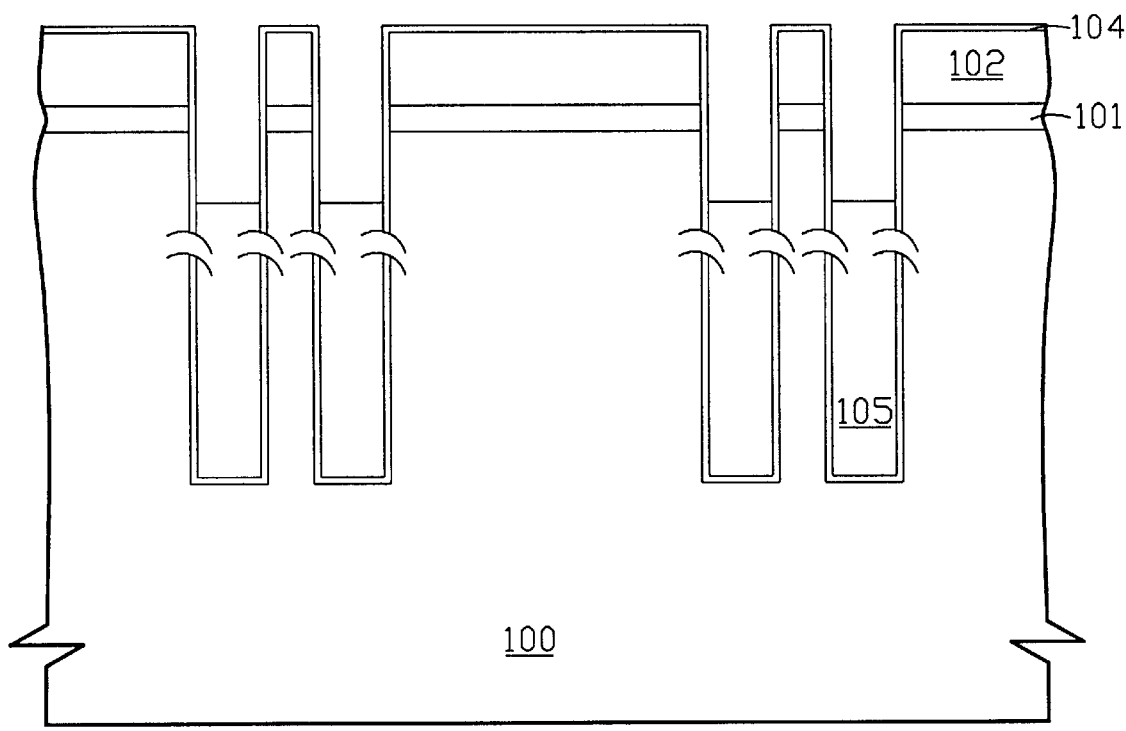
Figure 1D:
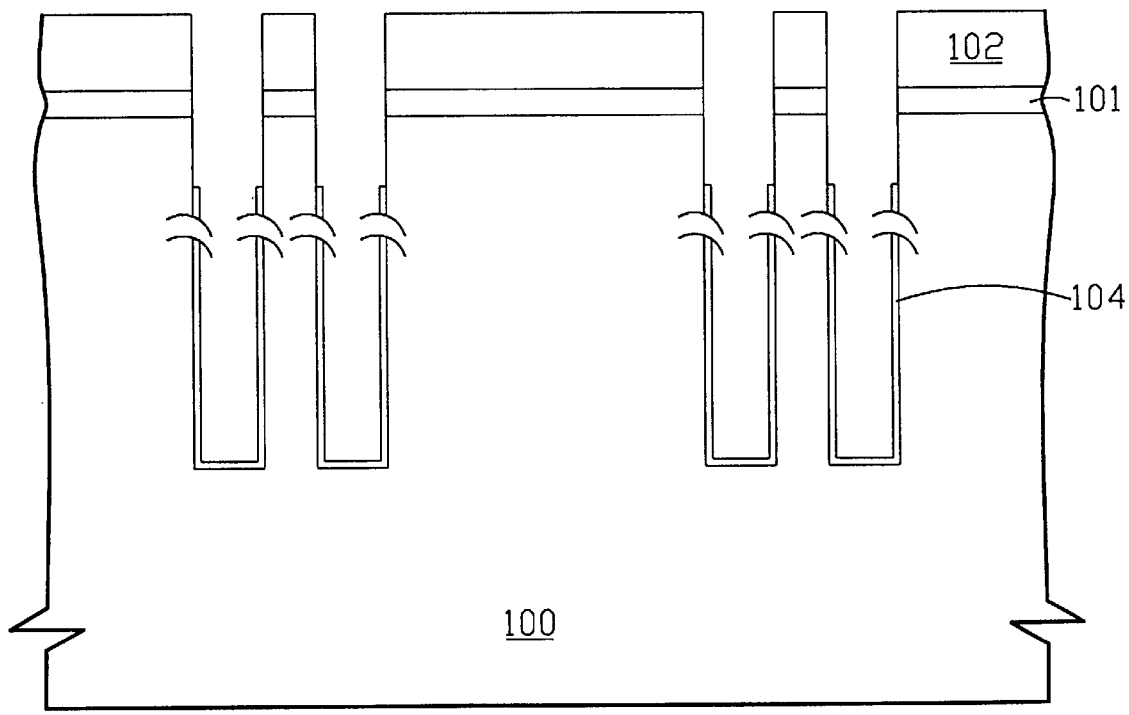
Figure 1E:
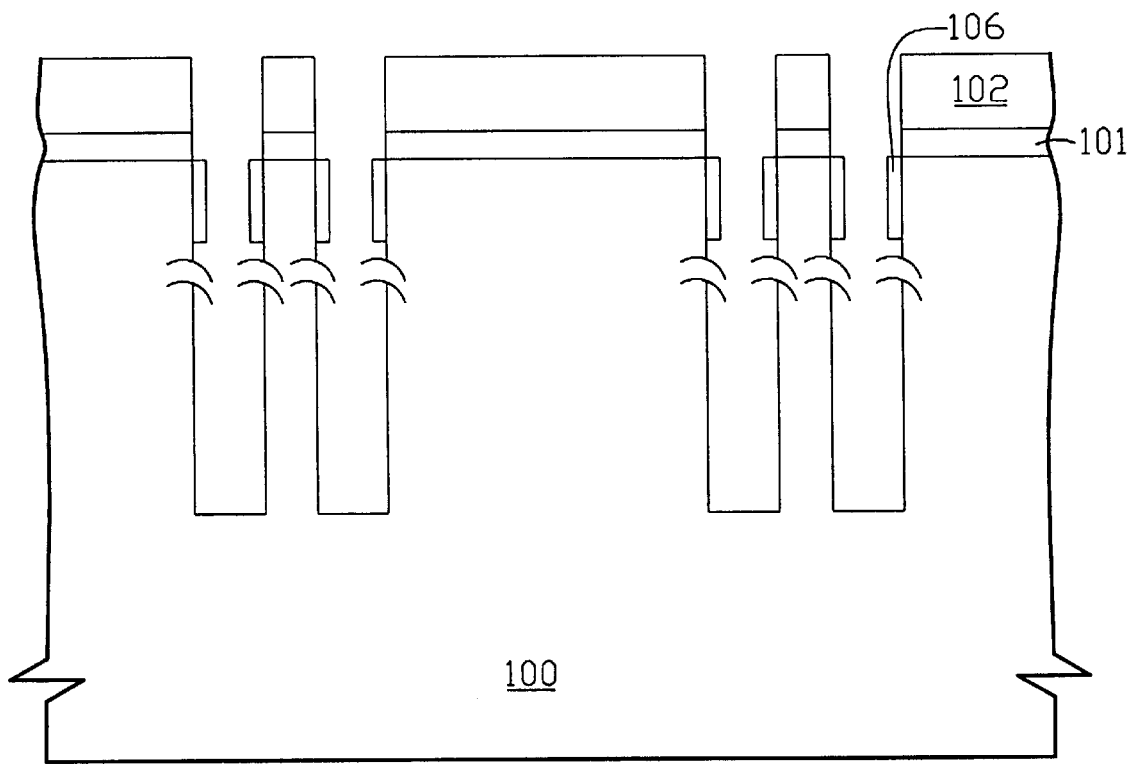
Figure 1F:
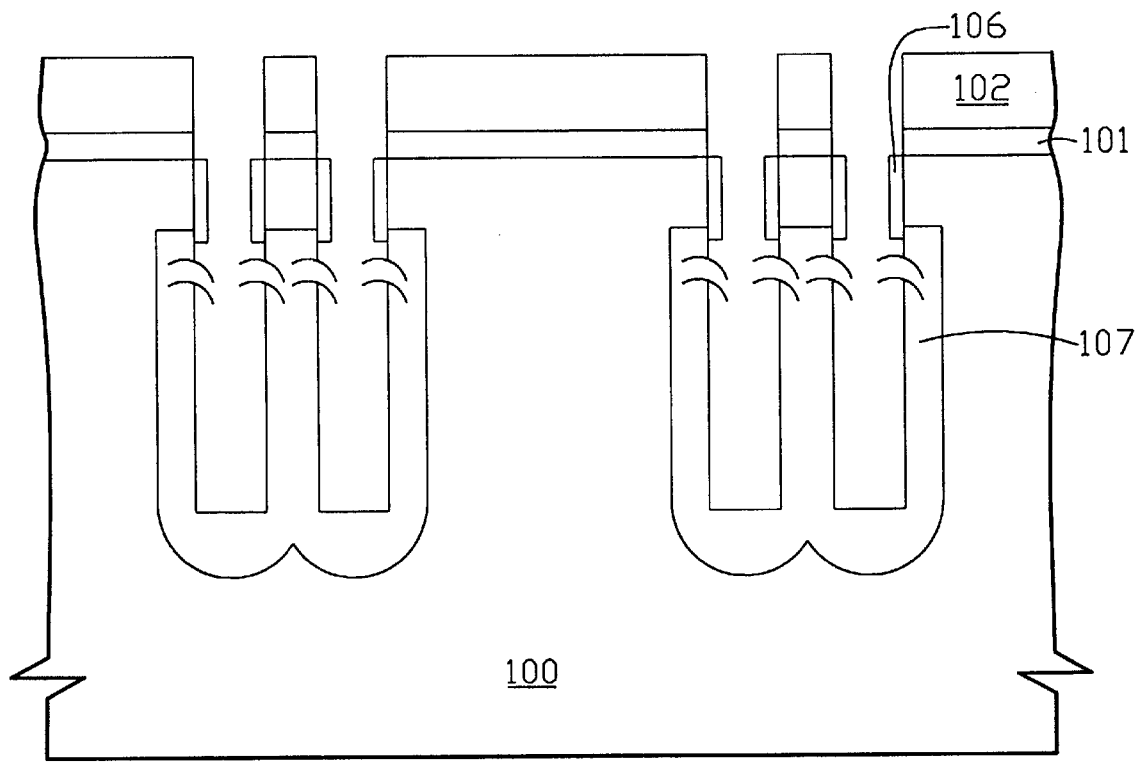
Figure 1G:
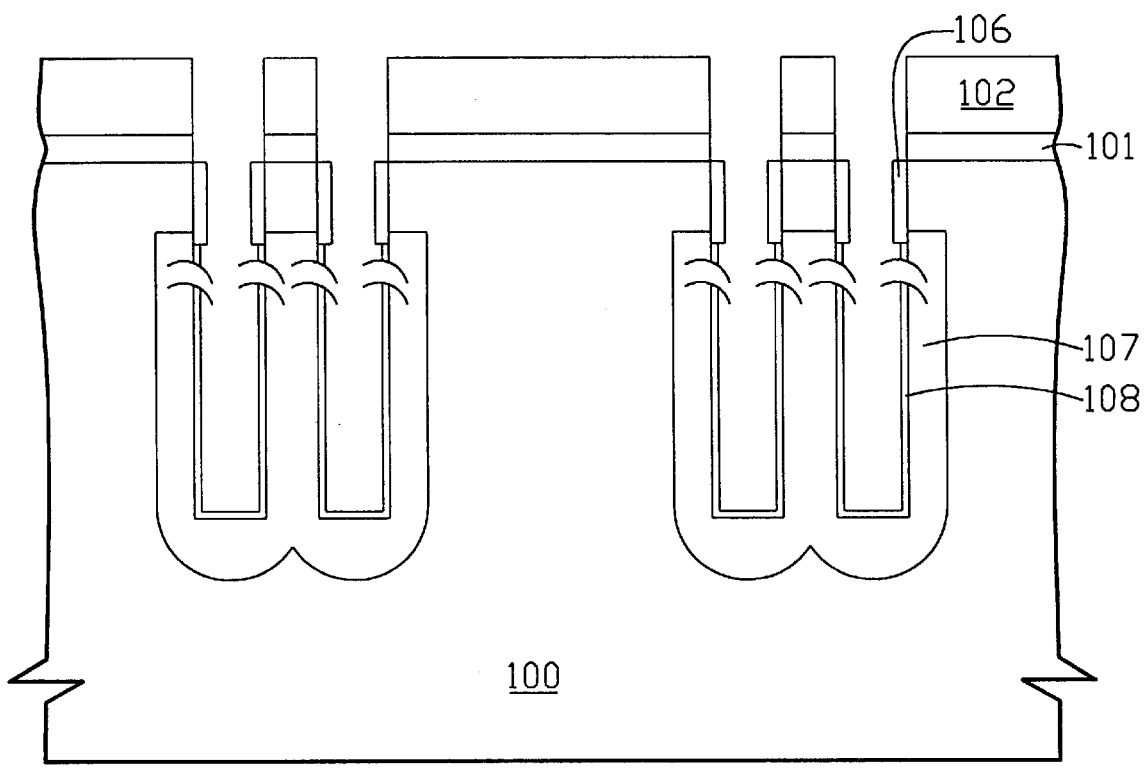
Figure 1H:
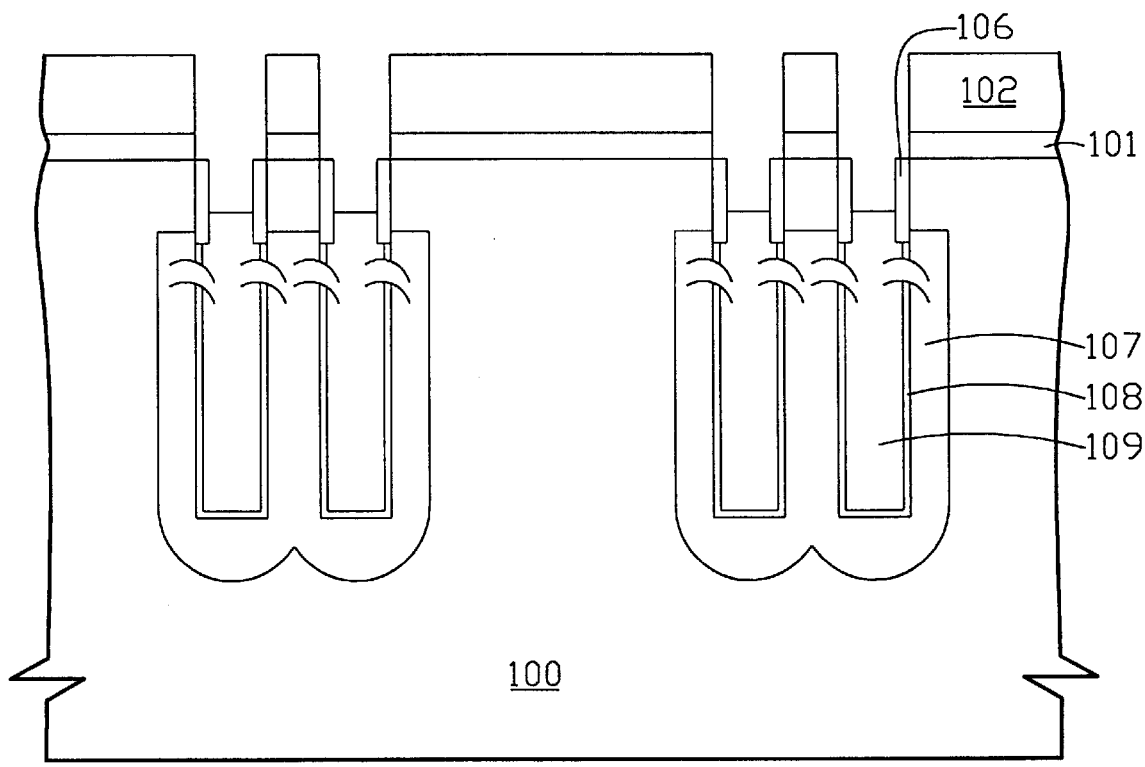
Figure 1I:
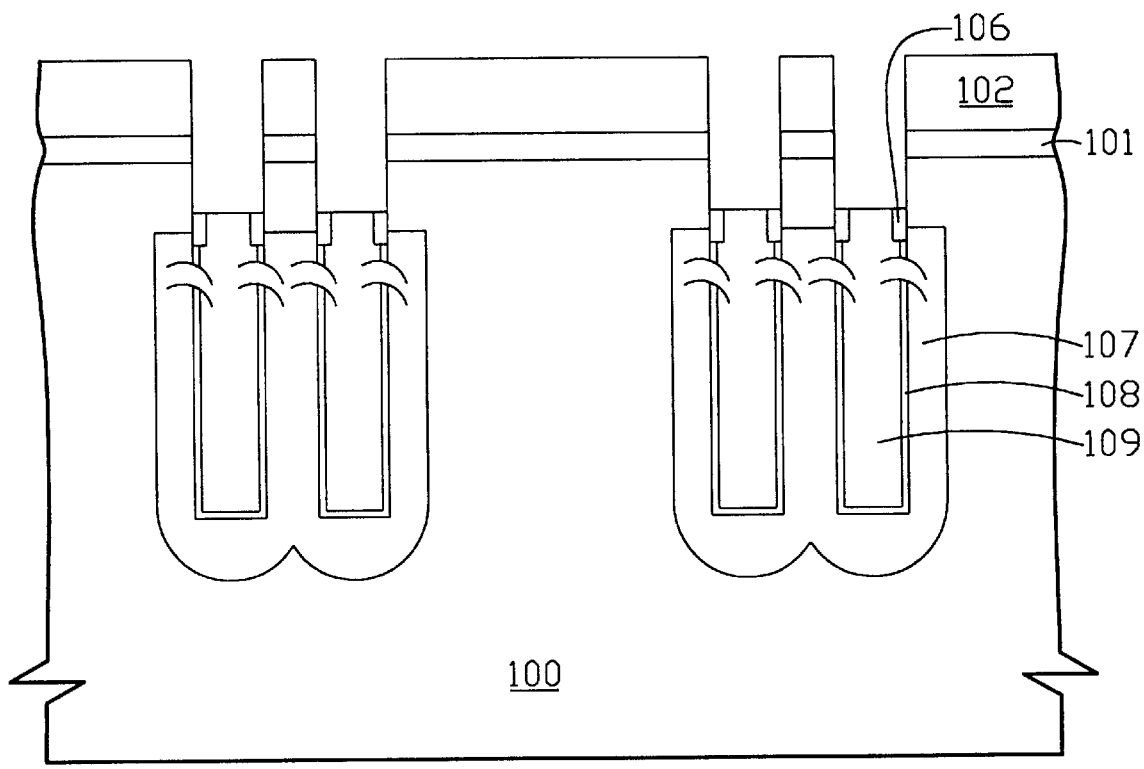
Figure 1J:
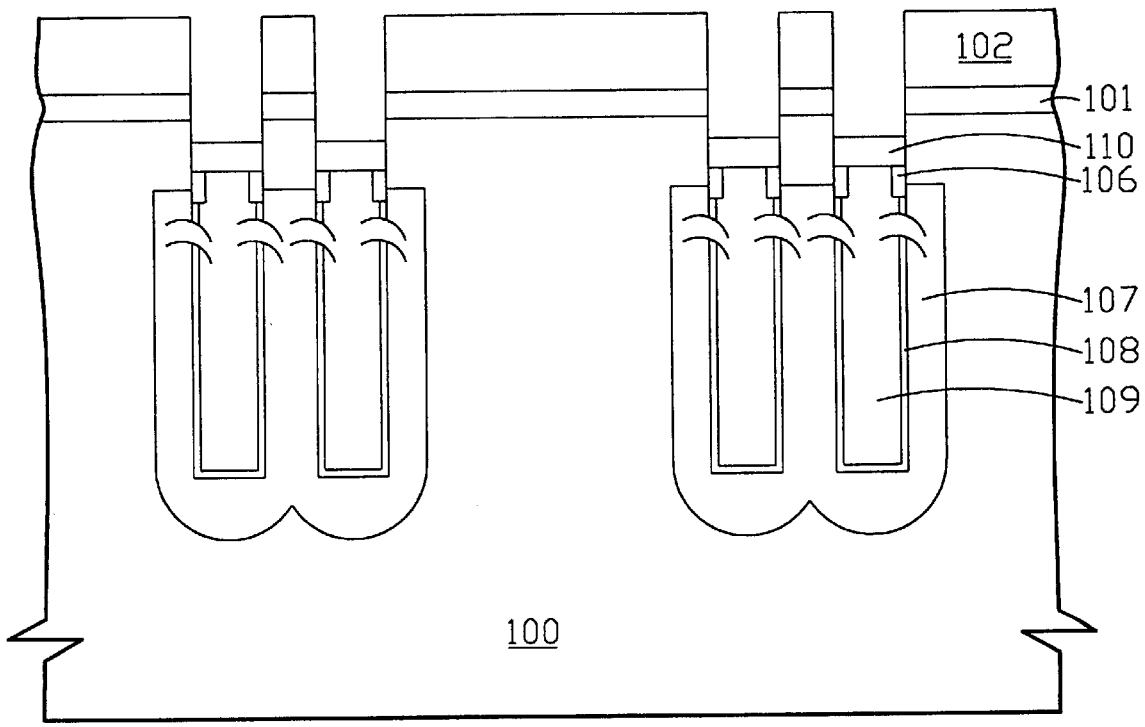
Figure 1K:
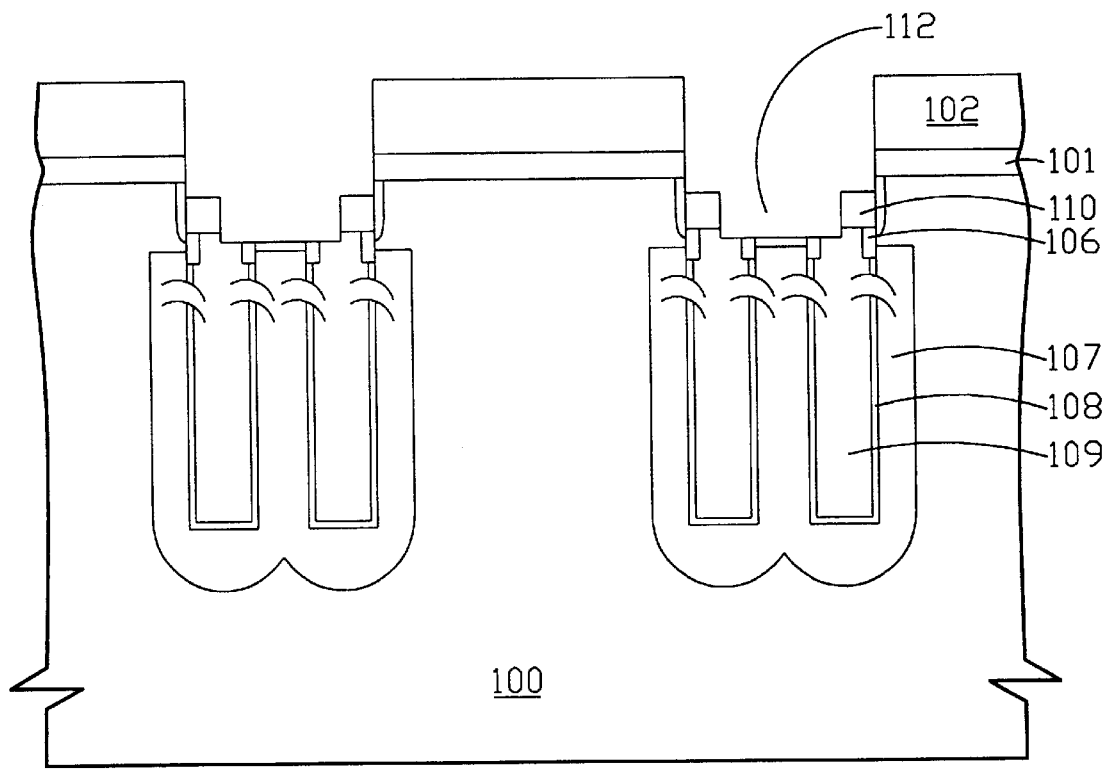
Figure 1L:
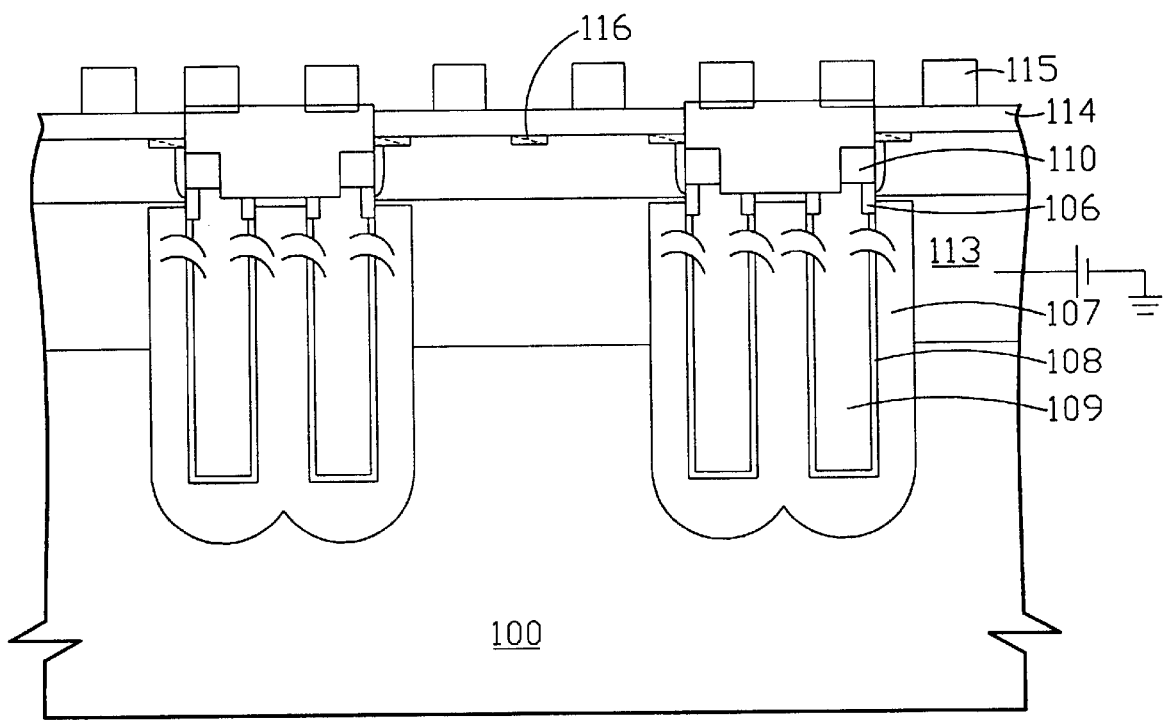
Figure 2A:
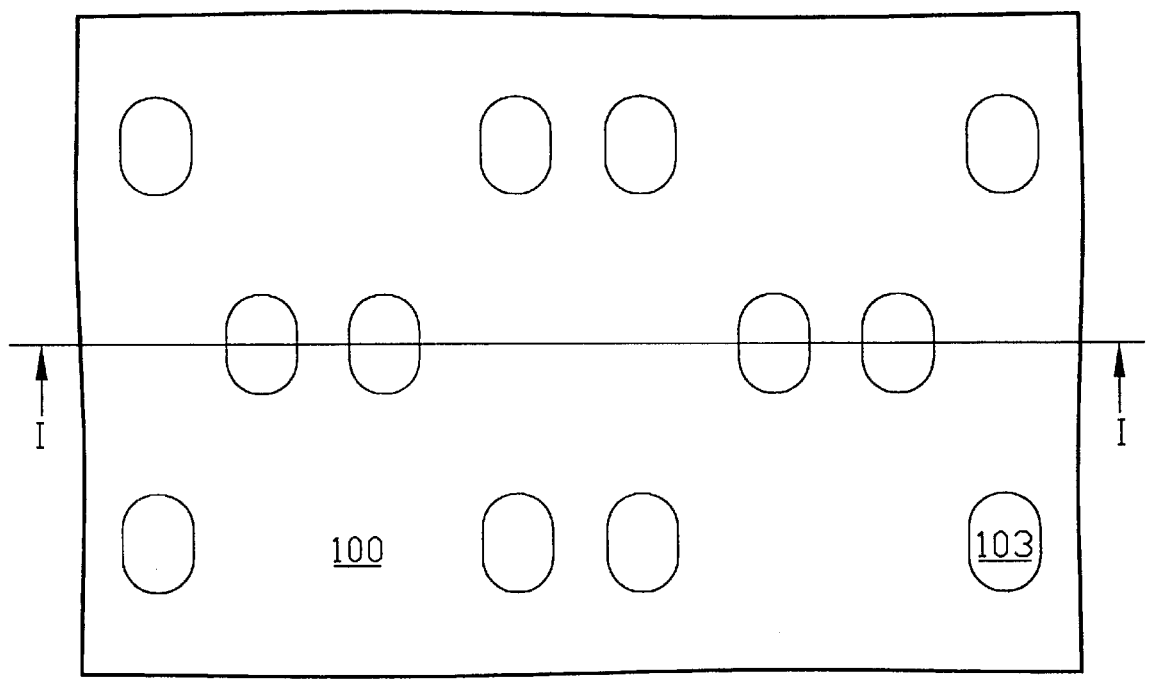
FIG. 2A is a top view of FIG. 1A.
Figure 2B:
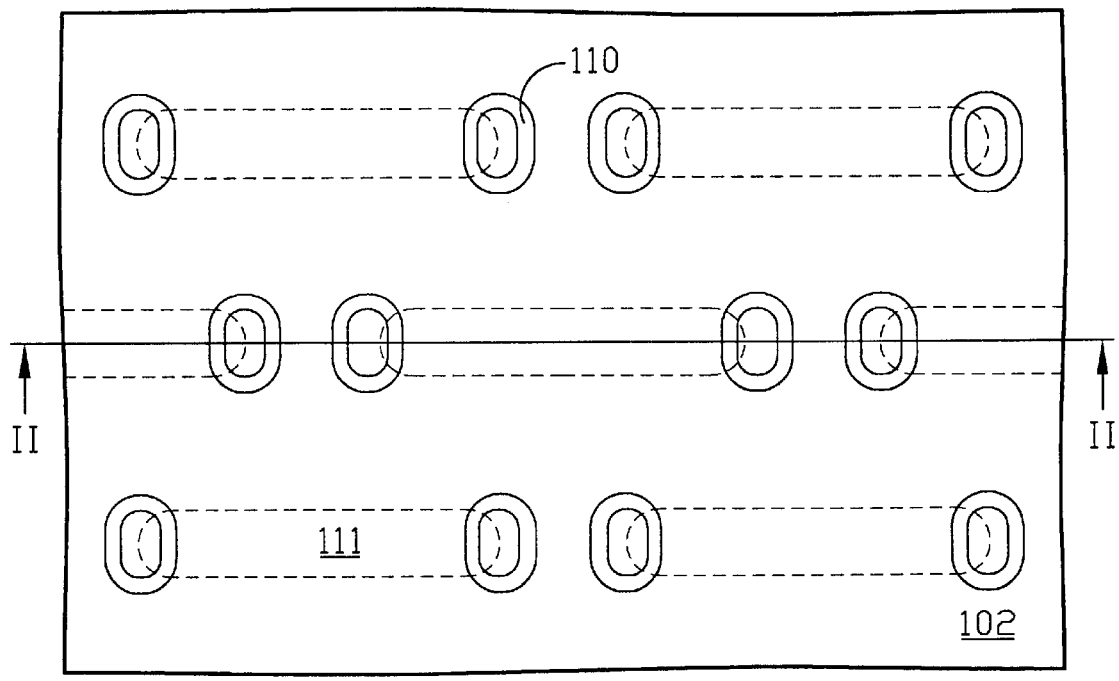
FIG. 2B is a top view of FIG. 1K.
Figure 2C:
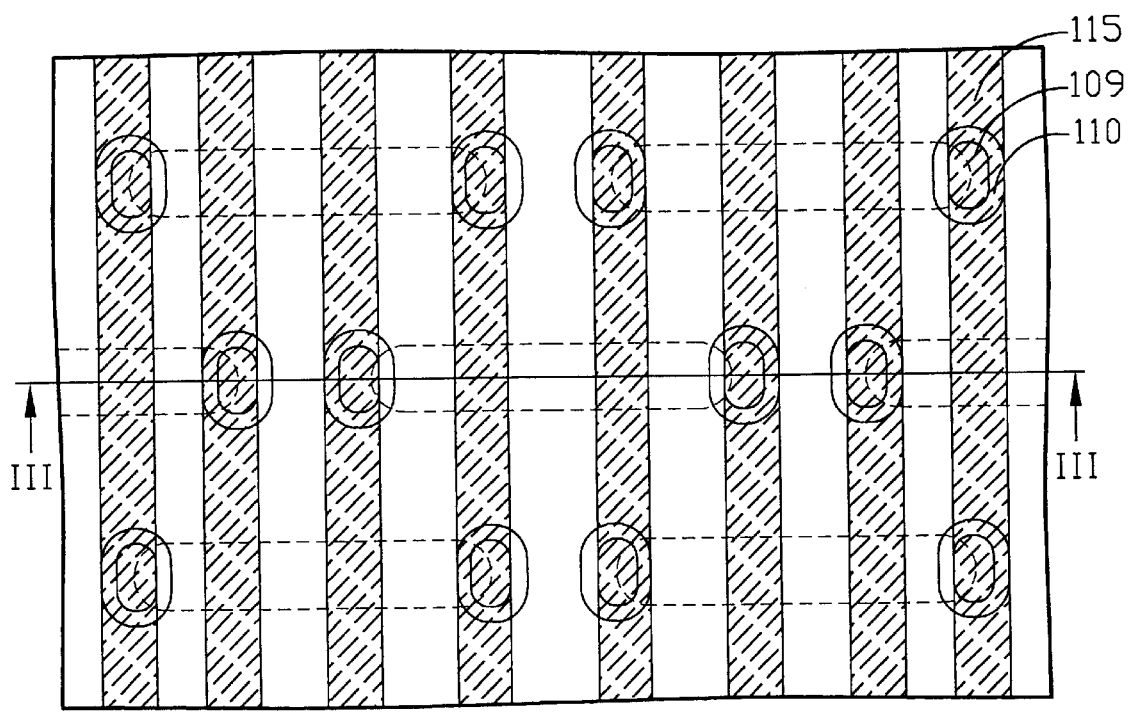
FIG. 2C is a top view of FIG. 1L.
Figure 3A:
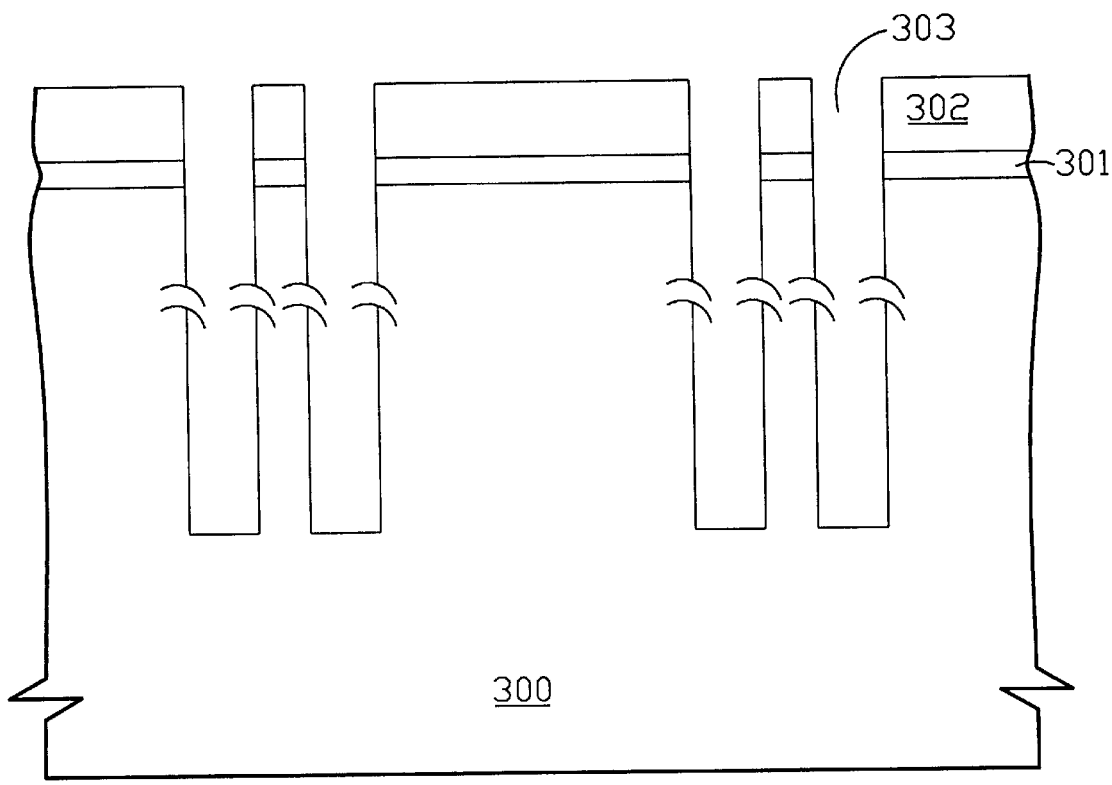
FIGS. 3A through 3M are schematic cross-sectional views of various steps of manufacturing an array of DRAM cells with buried trench capacitors according to one preferred embodiment of the present invention.

Referring to FIG. 3A to FIG. 3M, and FIGS. 4A, 4B, 4C, 4D and 4E, the processing steps for forming an array of DRAM cells with buried trench capacitors according to one preferred embodiment of the present invention are described in detail. Referring to FIG. 3A and FIG. 4A, wherein FIG. 4A is a schematic top view of the initial processing steps of the present invention according to the preferred embodiment, and FIG. 3A is a schematic cross-sectional view along line IV—IV of FIG. 4A, the present method begins by providing a semiconductor substrate 300 with a first conductivity. The first conductivity can be either N type or P type conductivity. However, the semiconductor substrate 300 is preferably a P type single-crystal silicon substrate. A pad oxide layer 301 composed of silicon dioxide ($SiO_2$) is formed on the semiconductor substrate 300, for example by thermal oxidation. A first dielectric layer 302 is formed next, which is preferably a silicon nitride layer formed by a low pressure chemical vapor deposition method using reactant gases of $SiH_2Cl_2$ and $NH_3$.

The first dielectric layer 302 is patterned by the known photolithography and etching process so as to form a plurality of rows of buried trenches 303 in the semiconductor substrate 300. Seeing FIG. 4A, each row of the buried trenches 303 comprises a plurality of pairs of neighboring buried trenches 303, each pair of the neighboring buried trenches 303 separates from each other for a predetermined distance. More specifically, a photoresist and anisotropic plasma etching process are used to etch the capacitor trench areas for the buried trench capacitor in regions under the device areas that will be formed later. The silicon nitride layer 302 and the pad oxide layer 301 are anisotropically plasma etched in a high-density plasma (HDP) etcher or in a reactive ion etcher using a gas containing fluorine (F), such as $CF_4$. The etching is continued to form the buried trench 303 in the semiconductor substrate 300 in which the capacitor anode electrode will be formed. Preferably, the buried trench 303 is etched using anisotropic plasma etching with a reactant gas mixture containing chlorine ($Cl_2$).

Figure 3B:
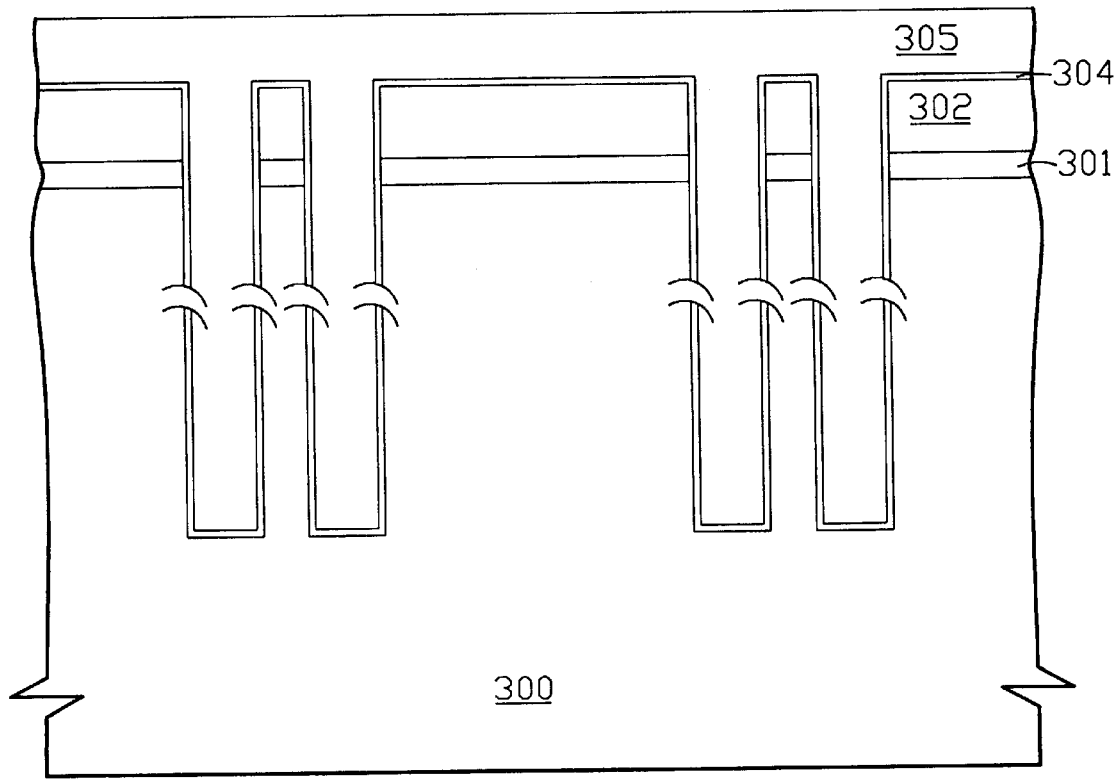
Figure 3C:
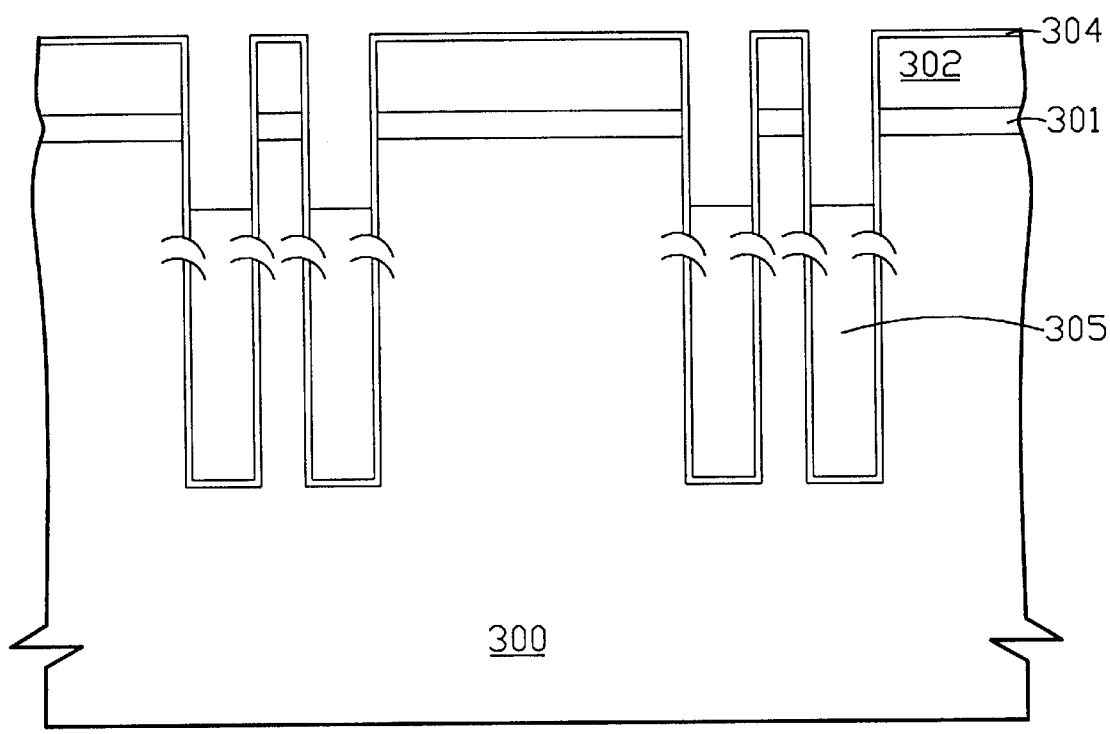
Figure 4A:
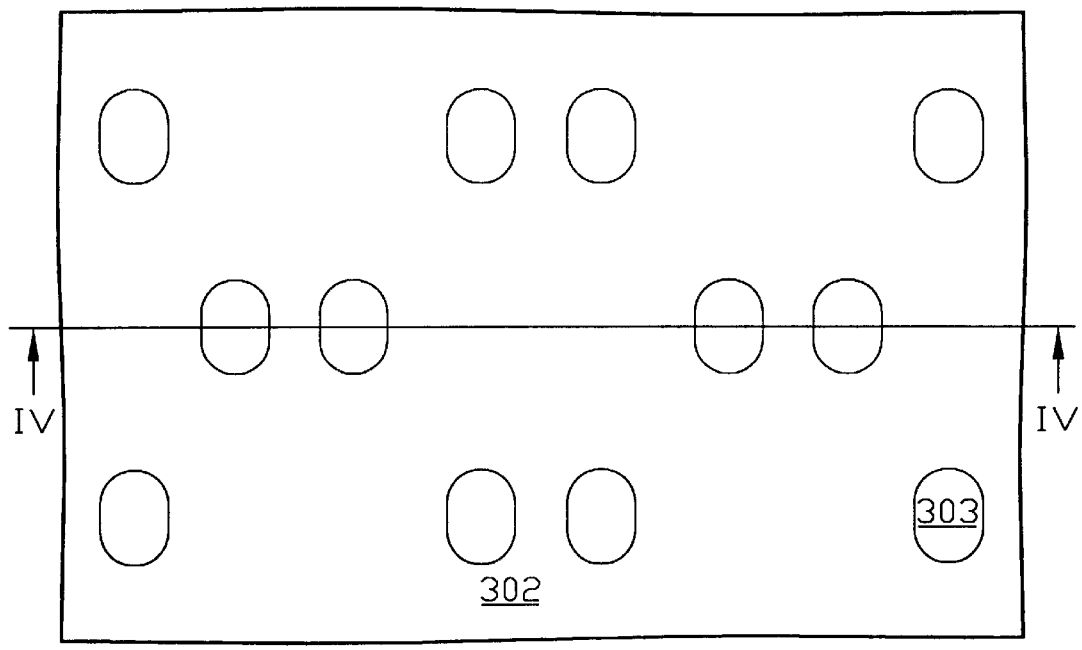
FIG. 4A is a top view of FIG. 3A.

Referring next to FIG. 3B, the photoresist is stripped away and a conformal dielectric layer 304 is formed on the surface of the semiconductor substrate 300 in the buried trenches 303. For example, the conformal dielectric layer 304 can be a silicon nitride layer deposited by a low pressure chemical vapor deposition method using reactant mixture of $SiH_2Cl_2$ and $NH_3$. Then, a sacrificial layer 305 is formed on the conformal dielectric layer 304 to fill the buried trenches 303. The sacrificial layer 305 can be a silicon oxide layer, such as PSG, BPSG, and SOG (spin on glass). Then, referring to FIG. 3C, the sacrificial layer 305 is partially removed so that the depth of the sacrificial layer 305 is under the surface of the first dielectric layer 302. The sacrificial layer 305 is preferably partially removed by a dry etching method, for example, using an anisotropic plasma etching method with a fluorine-based etchant to partially remove the sacrificial layer 305 formed of the silicon oxide layer.

Figure 3D:
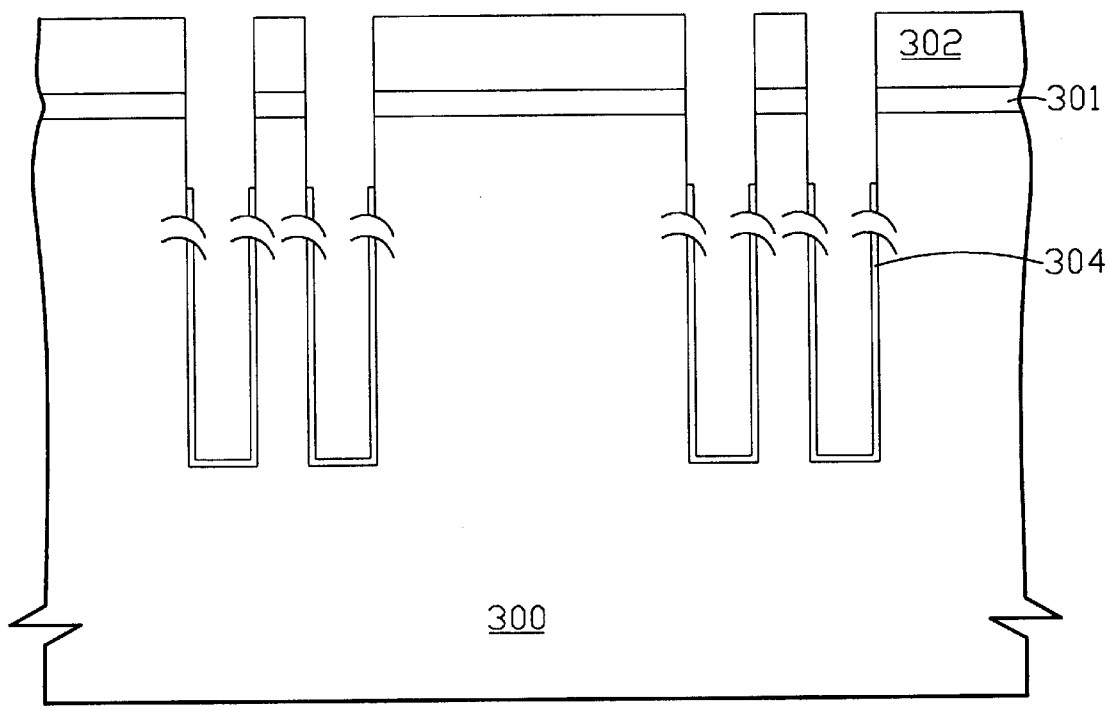

Referring to FIG. 3D, then, the portions of the conformal dielectric layer 304 uncovered by the sacrificial layer 305 are removed, preferably using an anisotropic dry etching method. For example, the conformal dielectric layer 304 of silicon nitride can be removed by an anisotropic plasma etching method using a fluorine-based etchant. Thereafter, the left portions of the sacrificial layer 305 are removed way by the dry etching method as mentioned above. As a result, the left portions of the conformal dielectric layer 304 are exposed.

Figure 3E:
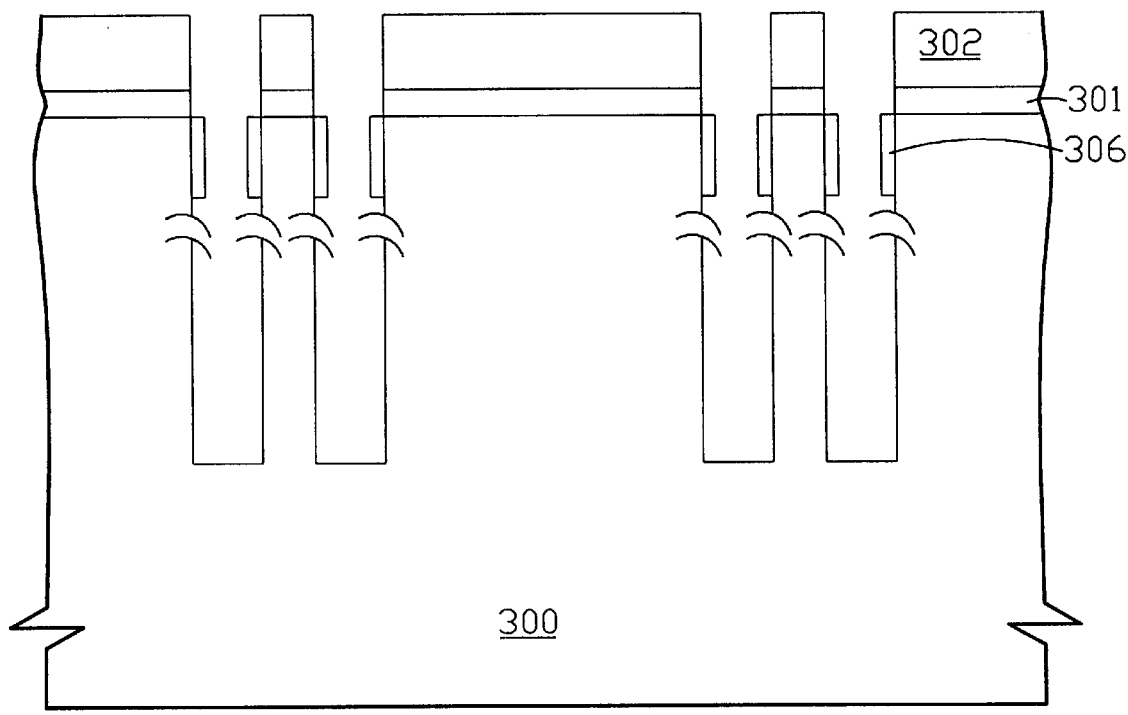

Referring to FIG. 3E, a collar oxide layer 306 is formed around the inner sidewalls of the buried trench 303 uncovered by the left portions of the conformal dielectric layer 304. The collar oxide layer 306 can be formed by thermal oxidation in an oxygen-contained environment. Then, the left portions of the conformal dielectric layer 304 are removed away. For example, the left portions of the conformal dielectric layer 304 of silicon nitride can be removed by a dip wet etching method with hot $H_3PO_4$ aqueous solution.

Figure 3F:
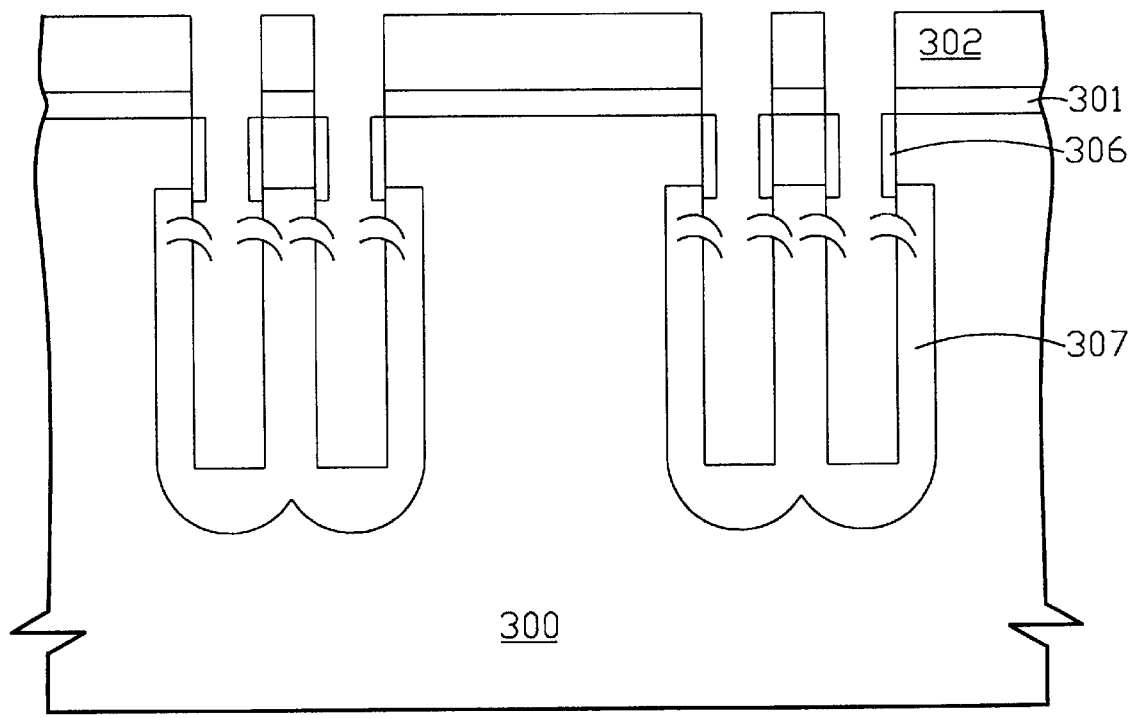

Referring next to FIG. 3F, a diffusion region 307 with a second conductivity opposite to the first conductivity is formed around the surrounding of each buried trench 303 in the semiconductor substrate 300 except for the portions of the semiconductor substrate 300 covered by the collar oxide layer 306. The diffusion region 307 is served as the first capacitor electrode of a buried trench capacitor which will be formed later. In the preferred embodiment, the diffusion region 307 respectively surrounding one of the pair of the neighboring buried trenches 303 is adjacent to each other. The diffusion region 307 is preferably formed by thermal diffusion with N type impurity gas to dope the surface of the semiconductor substrate 300 in the buried trenches 303. However, the regions of the semiconductor substrate 300 covered by the collar oxide layer 306 and the first dielectric layer 302 are not doped.

Figure 3G:
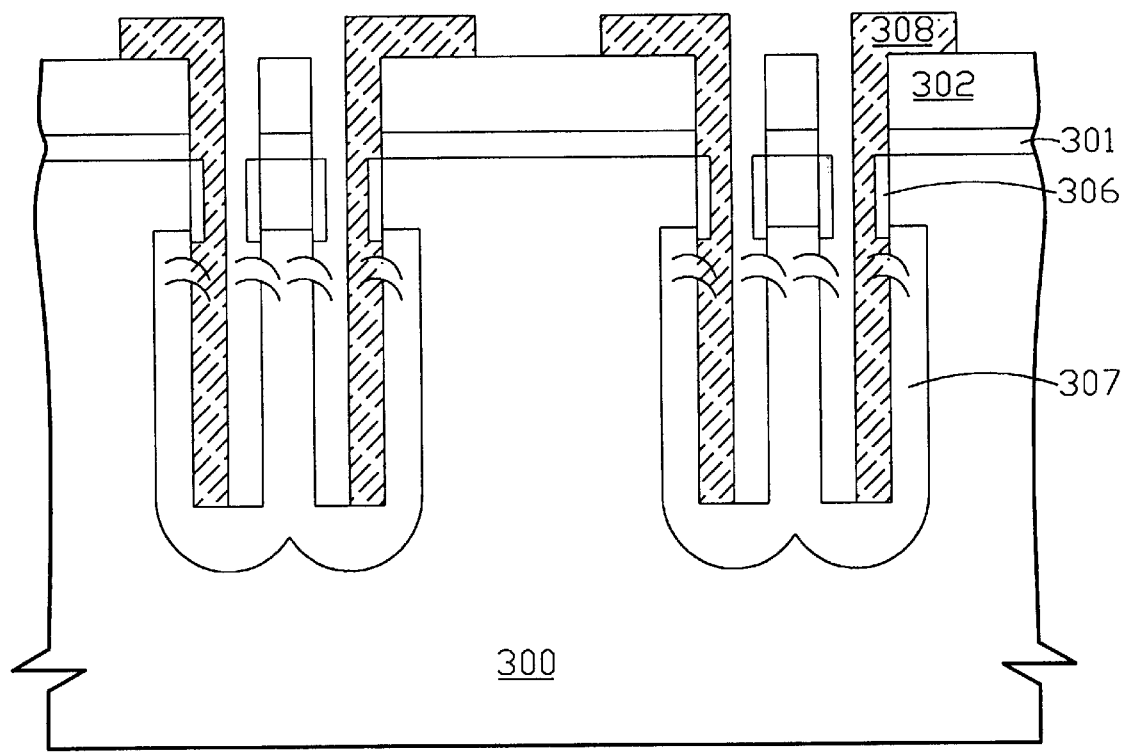
Figure 4B:
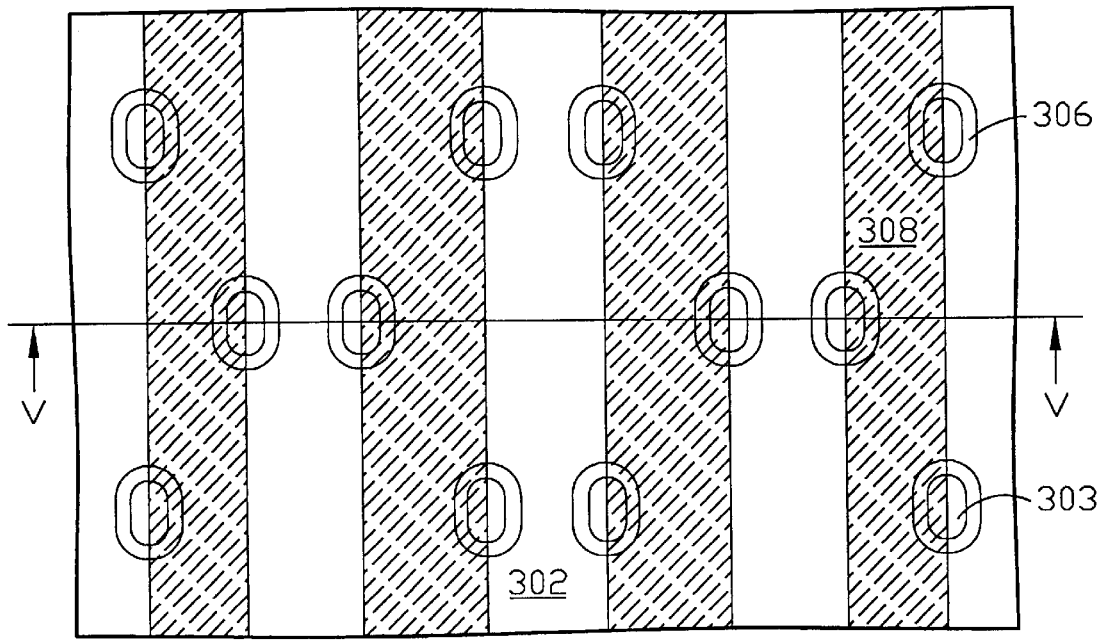
FIG. 4B is a top view of FIG. 3G.

Subsequently, referring to FIGS. 3G and 4B, wherein FIG. 4B is a schematic top view illustrating the following steps and FIG. 3G is a schematic cross-sectional view along line V—V of FIG. 4B, a photolithography and etching process is performed to laterally remove the portions of the collar oxide layer 306 around the inner sidewalls of the buried trenches 303 neighboring with each other in the pair of the neighboring buried trenches 303. A photoresistor layer 308 serving as an etching mask is coated on the semiconductor substrate 300 and the portions of the collar oxide layer 306 uncovered by the photoresistor layer 308 are etched away. Then, the photoresistor layer 308 is stripped away.

Figure 3H:
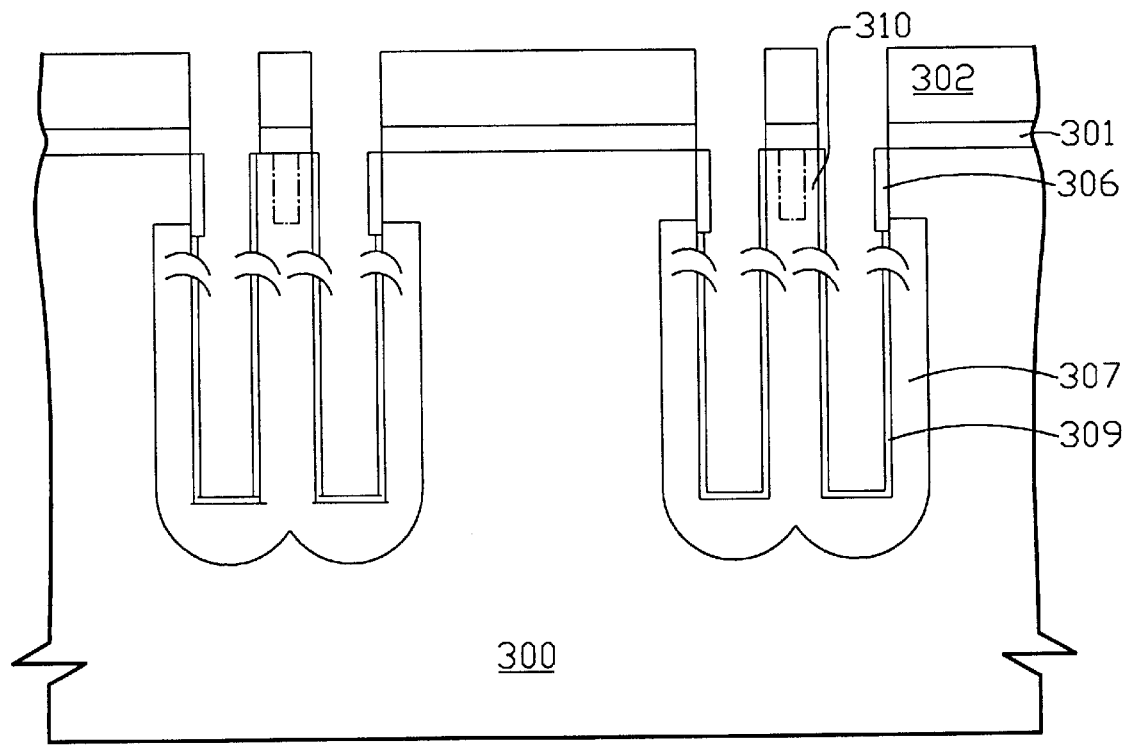
Figure 4C:
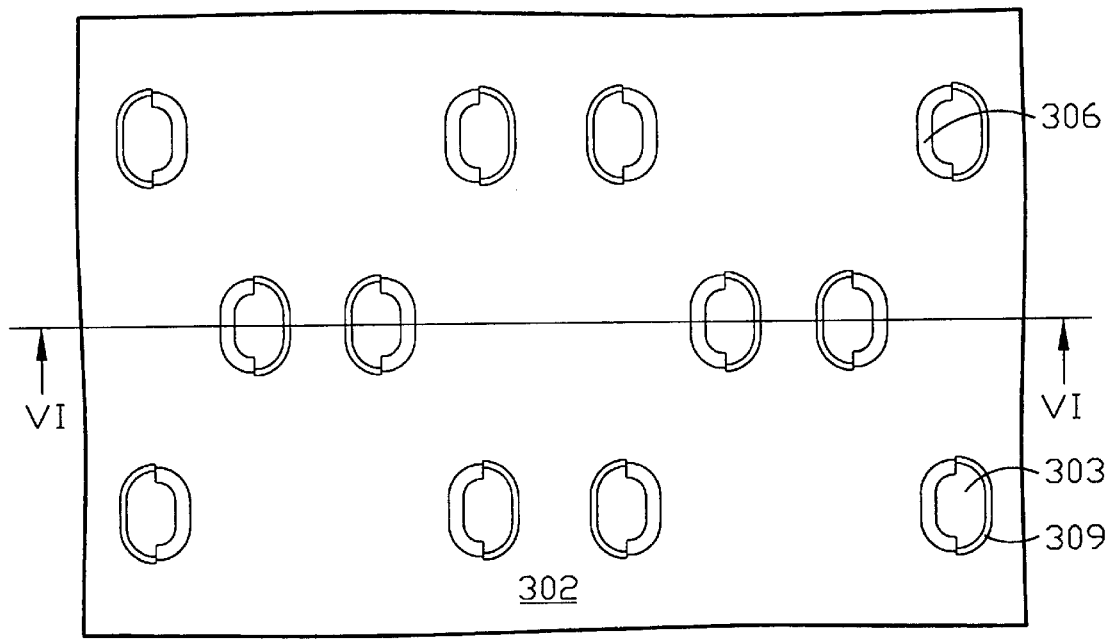
FIG. 4C is a top view of FIG. 3H.

Referring next to FIGS. 3H and 4C, wherein FIG. 4C is a schematic top view illustrating the following steps and FIG. 3H is a schematic cross-sectional view along line VI—VI of FIG. 4C, a second dielectric layer 309 is formed around the inner peripheral area of the buried trench 303 uncovered by the left portion of the collar oxide layer 306, serving as an insulator film of the buried trench capacitor which can be completed later. The second dielectric layer 309 is preferably composed of a silicon nitride/silicon dioxide (NO) composite layer. The silicon nitride/silicon dioxide (NO) composite layer is preferably formed by depositing a silicon nitride layer with a low pressure chemical vapor deposition method around the inner peripheral area of the buried trench 303 uncovered by the left portion of the, collar oxide layer 306, then partially oxidizing the silicon nitride layer to a silicon dioxide layer by a thermal annealing step in an oxygen-contained environment. Because the mechanism for forming the silicon nitride/silicon dioxide (NO) composite layer, there are positive fixed charges occurring in the NO composite layer near the interface between the NO composite layer and the semiconductor substrate 300, for example the P type silicon substrate. These positive fixed charges will induce an inversion layer 310 on the semiconductor interface, for example the silicon interface that can be used as the first capacitor electrode of the buried trench capacitor. It should be noted that there is not any similar effect will occur when the NO composite layer is formed on the collar oxide layer 306.

Figure 3I:
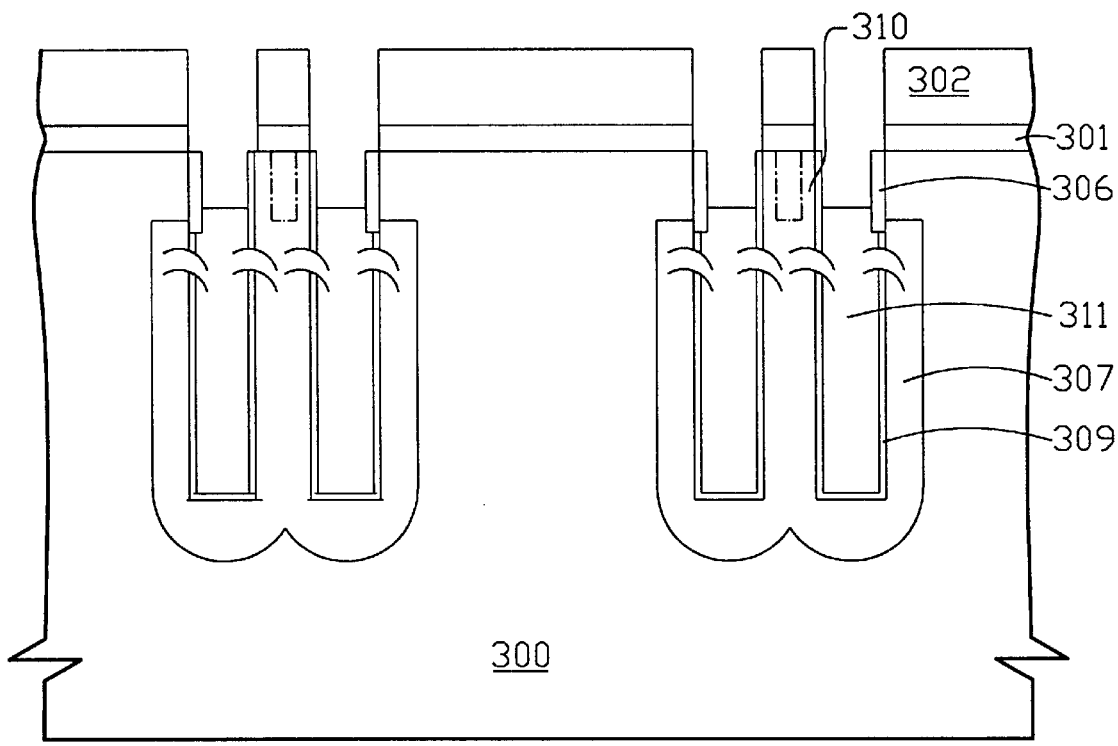

Following, referring to FIG. 3I, a conductive layer 311 with the second conductivity is formed on the semiconductor substrate 300 to fill the buried trenches 303, and serving as!the second capacitor electrode of the buried trench capacitor. The conductive layer 311 is preferably an N type doped polysilicon layer formed by in-situ doping with asenic using a dopant such as $AsH_3$ during the polysilicon deposition with a low pressure chemical vapor deposition method using a reactant gas of $SiH_4$. A portion of the conductive layer 311 is removed, preferably by an anisotropic dry etching method, so that a portion of the left collar oxide layer 306 in the buried trench 303 is exposed. A portion of the conductive layer 311 of the N type doped polysilicon layer can be removed by an anisotropic plasma etching method with an etchant containing chlorine species.

Figure 3J:
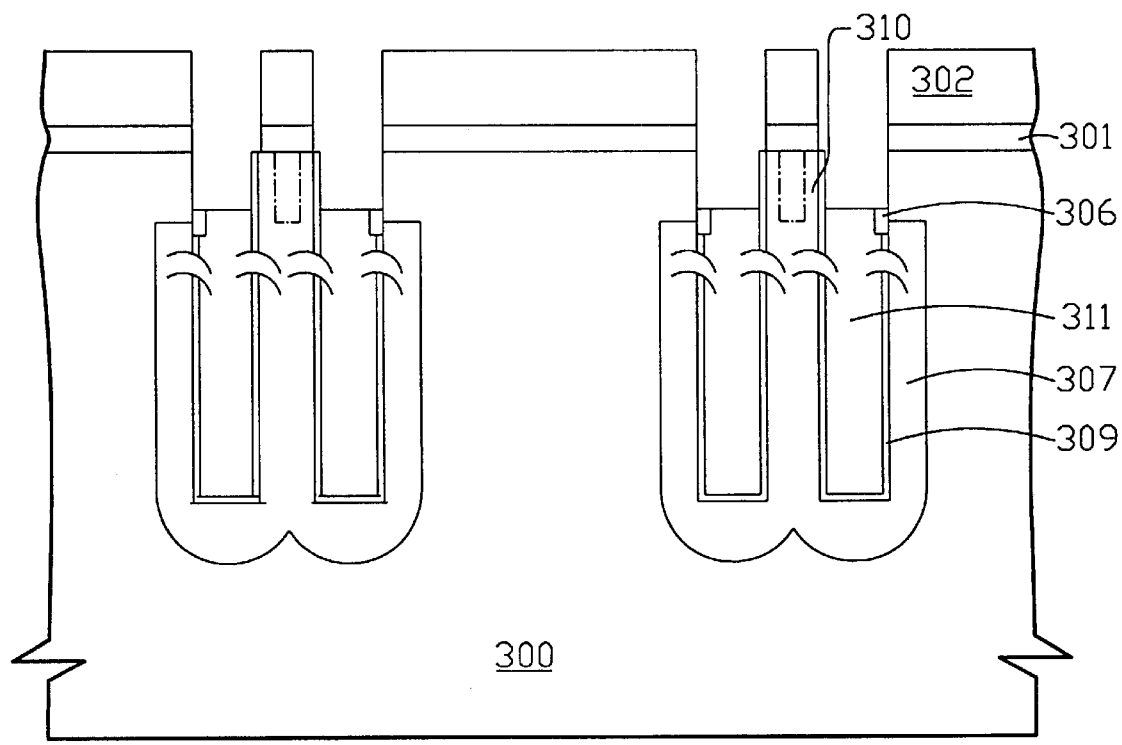
Figure 3K:
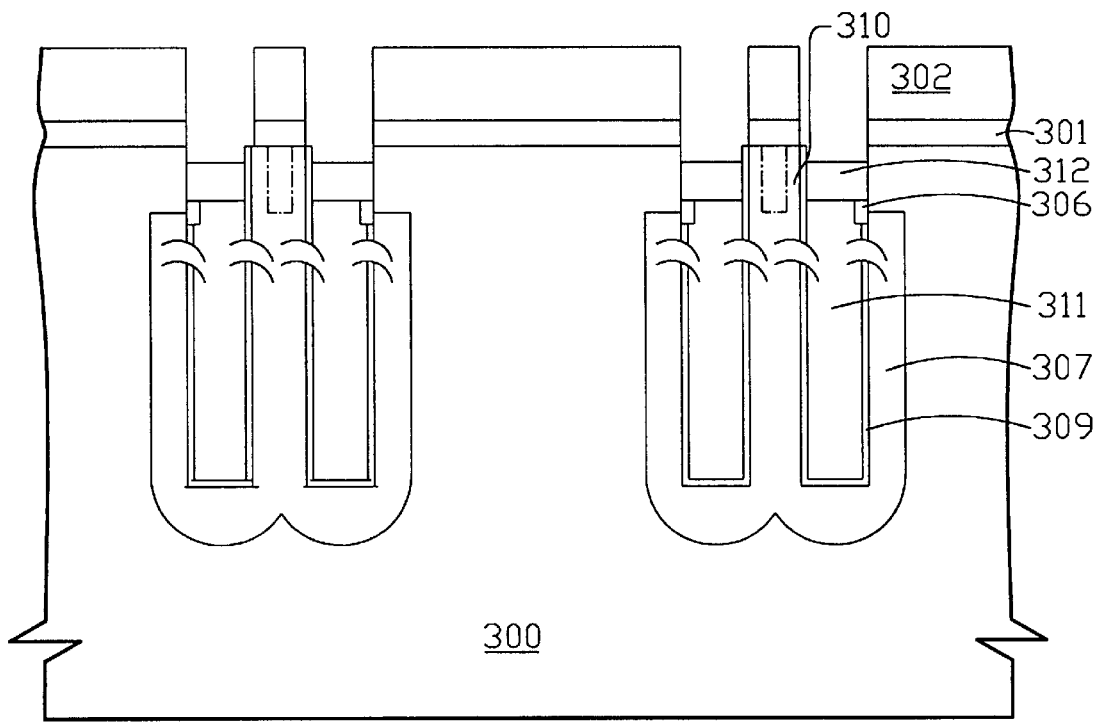

Referring next to FIG. 3J, the exposed portion of the left collar oxide layer 306 in the buried trench 303 is removed, from the surface to the depth of the conductive layer 311, preferably by an anisotropic plasma etching method with a fluorine-based etchant. Then, referring to FIG. 3K, a buried conductive strap 312 is formed on the conductive layer 311 in the buried trench 303, and doped with N type dopants by ion implantation. An annealing step is performed so that the N type dopants in the buried conductive strap 312 out diffuse into the semiconductor substrate 300 (see FIG. 3L) which can electrically couple a source/drain region of an access transistor of a DRAM cell and the second capacitor electrode of the buried trench capacitor formed of the conductive layer 311. Hence, in accordance with the above steps, the buried trench capacitor is completed.

Figure 3L:
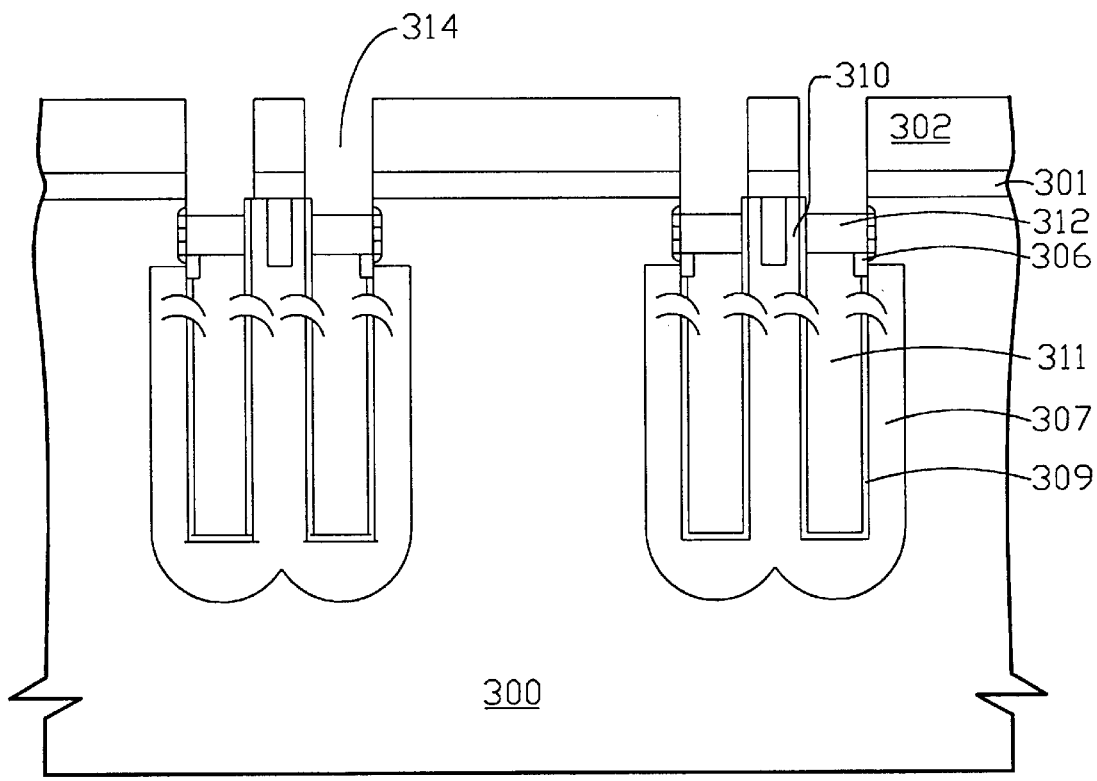
Figure 4D:
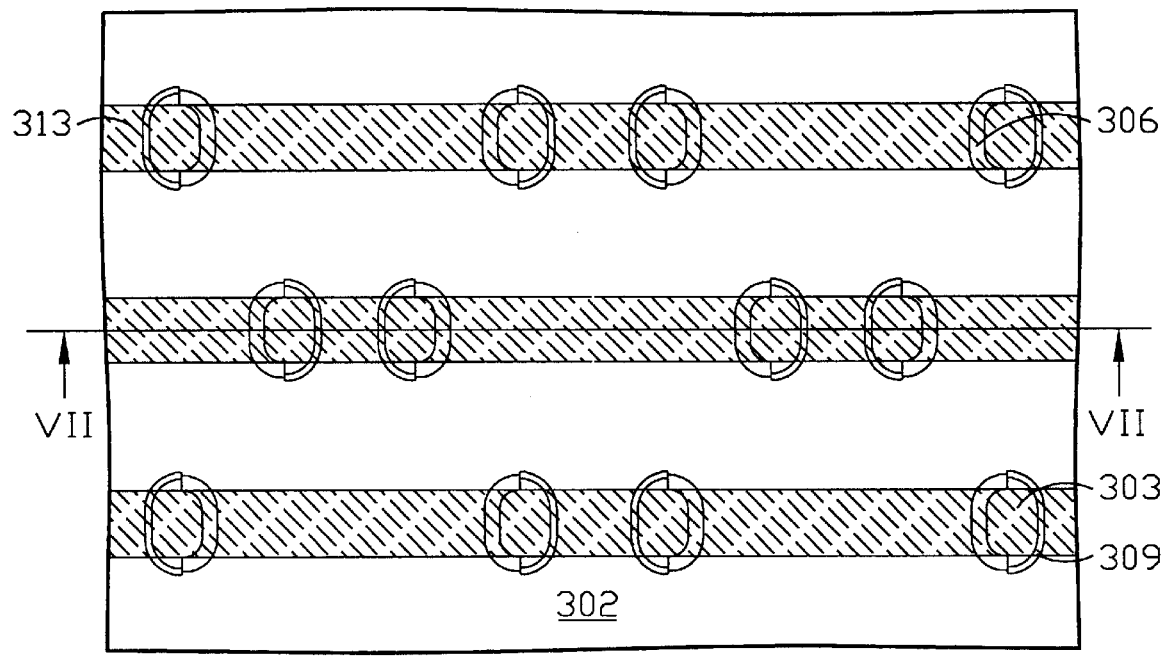
FIG. 4D is a top view of FIG. 3L.

Referring to FIG. 3L and FIG. 4D, wherein FIG. 4D is a schematic top view illustrating the following steps and FIG. 3L is a schematic cross-sectional view along line VII—VII of FIG. 4D, defining active areas for the source/drain regions of the access transistors of the array of DRAM cells using a strip type pattern 313 along the rows of the buried trenches 303. The result is as shown in FIG. 3L, a plurality of trench isolation regions 314 are formed on the conductive layer 312 in the semiconductor substrate 300. Each of the trench isolation regions 314 is aligned with one of the buried trench capacitor, and isolates one access transistor formed above later from the buried trench capacitor.

Figure 3M:
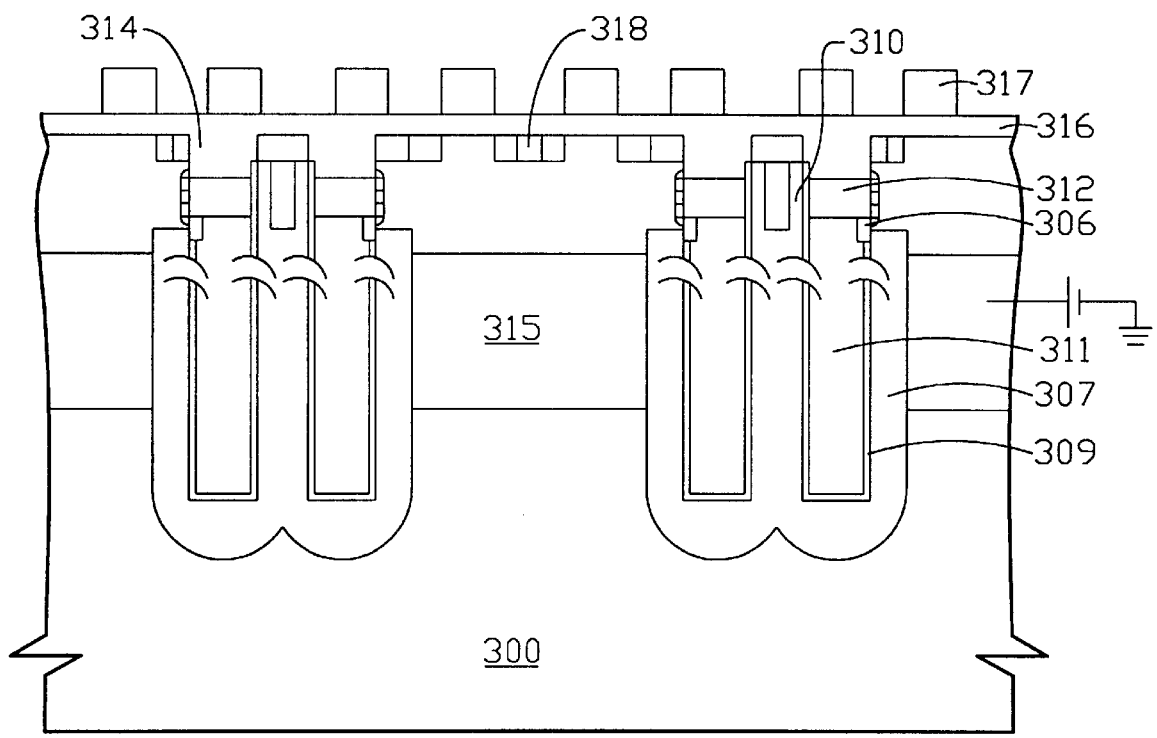
Figure 4E:
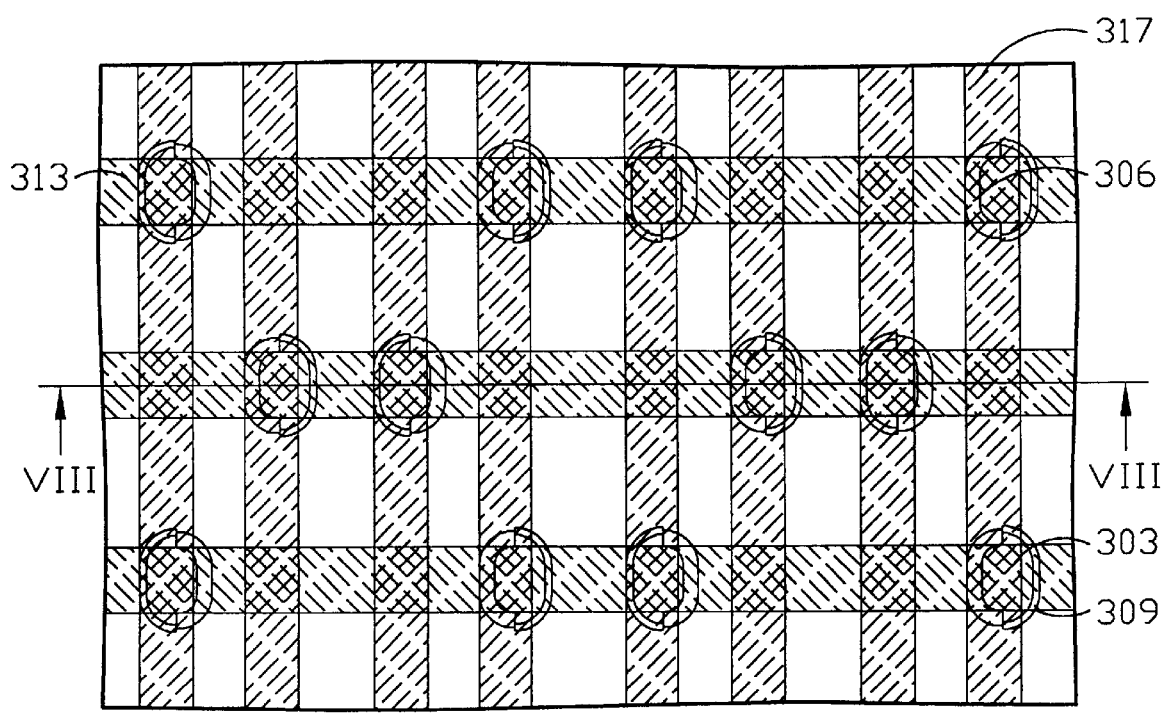
FIG. 4E is a top view of FIG. 3M.

Referring to FIGS. 3M and 4E, wherein FIG. 4E is a schematic top view illustrating the following steps and FIG. 3M is a schematic cross-sectional view along line VIII—VIII of FIG. 4E, the trench isolation regions 314 are completed by filling an oxide layer and planarizing the oxide layer by a chemical mechanical polishing method, upon which, both of the first dielectric layer 302 and the pad oxide layer 301 are removed away. Then, a doped well 315 with the second conductivity, preferably an N well, is formed in the semiconductor substrate 300, by ion implantation. The doped well 315 electrically couples the first capacitor electrodes of the buried trench capacitors formed of the diffusion regions 307 to a positive voltage bias. Following, the access transistors are completed. A gate oxide layer 316 is formed on the semiconductor substrate 300 over the trench isolation regions 314 by thermal oxidation. Then, a conductive gate layer 317 including a plurality of strip type conductive gate is formed on the gate oxide layer 316 by a deposition and photolithography method. Each of the strip type conductive gates is served as a word line of the DRAM cells. The conductive gate layer 317 is formed in the way such that two access transistors are formed between two pairs of the neighboring buried trench capacitors, and they share a source/drain region 318, which will be formed later, formed therebetween (See FIG. 3M). The conductive gate layer 317 can be composed of an N type doped polysilicon layer and a tungsten silicide layer. The source/drain regions 318 are then formed by ion implantation. One source/drain region 318 of each access transistor is electrically coupled to the second capacitor electrode of one buried trench capacitor via the buried conductive strap 312, while the other source/drain region 318 shared by the two access transistors are connected to a bit line of the DRAM device. Thus, in accordance with the above steps, the array of DRAM cells with buried trench capacitors of the present invention are completed.

Accordingly, as shown in FIG. 3M, additional capacitance coming from the peripheral part of each buried trench capacitor of the pair of neighboring buried trench capacitors, which are not used by the conventional buried trench capacitor, can increase the capacitance of the buried trench capacitor without either deepening the depth of the buried trench capacitor or thinning down the effective insulator's thickness of the buried trench capacitor. Besides, more conductive layer 311 and buried conductive strap 312 are remained due to both reasons that replacing parts of the collar oxide layer 306 with a silicon nitride/silicon dioxide (NO) composite layer 309 and using a strip type pattern 313 to define active areas. Thus, Overall contact resistance of the buried conductive strap 312 can be reduced and properly controlled. On the other hand, there is an inversion layer 310 aside the periphery of each buried trench capacitor between the pair of neighboring buried trench capacitors. Because these inversion layers 310 can shield electric field from the second (top) capacitor electrode of each buried trench capacitor, there is not any interference issue between the neighboring DRAM cells. In summary, there are at least three advantages provided by the present invention compared with the conventional process. Firstly, capacitance of the present buried trench capacitor can be increased without either deepening the depth of the buried trench capacitor or thinning down the effective insulator's thickness of the buried trench capacitor. Secondly, process window for patterning the active areas can be greatly improved due to the strip type pattern 313. Thirdly, Overall contact resistance of the buried conductive strap 312 can be reduced and properly controlled.

The preferred embodiments are only used to illustrate the present invention, not intended to limit the scope thereof. Many modifications of the preferred embodiments can be made without departing from the spirit of the present invention.

What is claimed is:

1. A DRAM device with buried trench capacitors, comprising:

a semiconductor substrate with a first conductivity;

a plurality of access transistors on said semiconductor substrate, each said access transistor with a second conductivity opposite to the first conductivity and having a conductive gate connected to a word line, a source region connected to a bit line, and a drain region;

a plurality of trench isolation region in said semiconductor substrate and under said access transistors, wherein two said access transistors sharing one said source region are isolated between two pairs of neighboring trench isolation regions;

a pair of neighboring buried trench capacitors under the pair of said neighboring trench isolation regions, each of said neighboring buried trench capacitors being aligned with one of the pair of said neighboring trench isolation regions, and a buried conductive strap with the second conductivity formed therebetween, said buried conductive strap being electrically coupled to said drain region of one of said two access transistors sharing one said source region, wherein each of said neighboring buried trench capacitors includes an oxide layer along an upper portion of the inner sidewall of said buried trench capacitor below said buried conductive strap, each said oxide layer opposite to each other within the pair of said neighboring buried trench capacitors, a dielectric layer along the other portion of the inner peripheral area of each said buried trench capacitor except for the upper portion covered by said oxide layer, a conductive layer with the second conductivity filled in each said buried trench capacitor between said buried conductive strap and said dielectric layer for serving as a first electrode of said buried trench capacitor electrically coupled to said drain region of said access transistor via said buried conductive strap, a diffusion region with the second conductivity around the surrounding of each said buried trench capacitor in said semiconductor substrate except for the portion of said semiconductor substrate covered by said oxide layer, the respective diffusion region of the pair of said neighboring buried trench capacitors being adjacent to each other, and an inversion layer on the interface between said dielectric layer and said semiconductor substrate and adjacent to said diffusion region, both of said diffusion region and said inversion layer serving as a second electrode of said buried trench capacitor; and a well with the second conductivity electrically coupled with each said diffusion region.

2. The DRAM device with buried trench capacitors of claim 1, wherein the first conductivity is either of N type and P type conductivities.

3. The DRAM device with buried trench capacitors of claim 1, wherein said semiconductor substrate comprises a silicon substrate.

4. The DRAM device with buried trench capacitors of claim 1, wherein said dielectric layer comprises a silicon nitride/silicon dioxide (NO) composite layer.

5. The DRAM device with buried trench capacitors of claim 1, wherein said buried conductive strap comprises a doped amorphous silicon layer.

6. The DRAM device with buried trench capacitors of claim 1, wherein said conductive layer comprises a doped polysilicon layer.

* * * * *